(12) United States Patent
Takeshima et al.

(10) Patent No.: US 9,023,429 B2
(45) Date of Patent: May 5, 2015

(54) METHOD OF MANUFACTURING SEMICONDUCTOR DEVICE AND SUBSTRATE PROCESSING APPARATUS

(71) Applicants: Yuichiro Takeshima, Toyama (JP); Osamu Kasahara, Toyama (JP); Kazuyuki Toyoda, Toyama (JP); Junichi Tanabe, Toyama (JP); Katsuhiko Yamamoto, Toyama (JP); Hisashi Nomura, Toyama (JP)

(72) Inventors: Yuichiro Takeshima, Toyama (JP); Osamu Kasahara, Toyama (JP); Kazuyuki Toyoda, Toyama (JP); Junichi Tanabe, Toyama (JP); Katsuhiko Yamamoto, Toyama (JP); Hisashi Nomura, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 13/626,382

(22) Filed: Sep. 25, 2012

(65) Prior Publication Data
US 2013/0078823 A1    Mar. 28, 2013

(30) Foreign Application Priority Data

Sep. 26, 2011 (JP) .................................. 2011-209169
Jun. 6, 2012 (JP) .................................. 2012-128763

(51) Int. Cl.
| H01L 21/02 | (2006.01) |
| C23C 16/00 | (2006.01) |
| C23C 16/56 | (2006.01) |
| C23C 16/54 | (2006.01) |
| H01L 21/67 | (2006.01) |
| H01L 21/687 | (2006.01) |
| C23C 16/44 | (2006.01) |
| C23C 16/46 | (2006.01) |
| H01L 21/683 | (2006.01) |
| H01L 21/677 | (2006.01) |

(52) U.S. Cl.
CPC .......... *C23C 16/54* (2013.01); *H01L 21/67109* (2013.01); *H01L 21/67754* (2013.01); *H01L 21/68764* (2013.01); *H01L 21/68771* (2013.01); *H01L 21/02164* (2013.01); *H01L 21/02219* (2013.01); *H01L 21/02274* (2013.01); *H01L 21/0228* (2013.01); *C23C 16/4408* (2013.01); *C23C 16/463* (2013.01)

(58) Field of Classification Search
CPC ............ H01L 21/67173; C23C 14/541; C23C 16/463
USPC ......... 427/255.5, 398.1, 398.4; 118/729, 730, 118/724, 725, 719; 438/758
See application file for complete search history.

(56) References Cited

U.S. PATENT DOCUMENTS 6,448,178 B1 * 9/2002 Suzuki et al. ................. 438/655
2005/0084610 A1 * 4/2005 Selitser ..................... 427/248.1

(Continued)

FOREIGN PATENT DOCUMENTS

| JP | 2008-524842 A | 7/2008 |
| KR | 10-2008-0063751 A | 7/2008 |
| KR | 10-2010-0028491 A | 3/2010 |

*Primary Examiner* — Colleen A Matthews
*Assistant Examiner* — Regan J Rundio
(74) *Attorney, Agent, or Firm* — Volpe and Koenig, P.C.

(57) ABSTRACT

A method of manufacturing a semiconductor device including: mounting a substrate on a substrate mounting member that is disposed in a reaction container; heating the substrate at a predetermined processing temperature and supplying a first gas and a second gas to the substrate to process the substrate; stopping supply of the first gas and the second gas, and supplying an inert gas into the reaction container; and unloading the substrate to outside the reaction container.

11 Claims, 9 Drawing Sheets

(56) References Cited

U.S. PATENT DOCUMENTS

| | | |
|---|---|---|
| 2007/0095286 A1 | 5/2007 | Baek et al. |
| 2007/0215036 A1* | 9/2007 | Park et al. .................. 117/88 |
| 2008/0193643 A1* | 8/2008 | Dip ........................ 427/255.5 |
| 2008/0254619 A1* | 10/2008 | Lin et al. ................... 438/675 |
| 2009/0117747 A1 | 5/2009 | Takagi et al. |
| 2010/0055312 A1* | 3/2010 | Kato et al. ............. 427/255.26 |
| 2010/0055315 A1* | 3/2010 | Honma ................... 427/255.28 |
| 2010/0260936 A1* | 10/2010 | Kato et al. ............. 427/255.28 |

\* cited by examiner

METHOD OF MANUFACTURING SEMICONDUCTOR DEVICE AND SUBSTRATE PROCESSING APPARATUS

CROSS-REFERENCE TO RELATED APPLICATIONS

This application is based upon and claims the benefit of priority from Japanese Patent Applications No. 2011-209169, filed on Sep. 26, 2011 and No. 2012-128763, filed on Jun. 6, 2012, the entire contents of which are incorporated herein by reference.

TECHNICAL FIELD

The present disclosure relates to a semiconductor device manufacturing method including a substrate processing process and a substrate processing apparatus that performs a substrate processing process.

BACKGROUND

For example, a substrate processing process that forms a thin film on a substrate is performed as one process of a method of manufacturing a semiconductor device such as a flash memory or a dynamic random access memory (DRAM). A thin film deposition apparatus, including a reaction chamber that forms respective thin films on a plurality of substrates mounted on a susceptor, is known as a substrate processing apparatus that performs a substrate processing process.

However, the above-described thin film deposition apparatus immediately unloads a substrate from a reaction container when a substrate processing is ended. That is, the thin film deposition apparatus unloads a high-temperature substrate, which is a substrate immediately after film formation process is processed, from the reaction container. Therefore, even after the substrate processing is ended, a thin film formed on the substrate is maintained at a high temperate by the residual heat of the substrate, and thus, an undesired reaction may occur on the thin film. Also, since the crystalline structure of the thin film formed on the substrate is not stabilized immediately after the substrate processing is ended, residual impurities in a processing region are adulterated into the film, and thus, the quality of the film may be degraded. Furthermore, a transfer robot that is used to unload the substrate may be damaged by heat.

SUMMARY

The present disclosure provides some embodiments of a method of manufacturing a semiconductor device and a substrate processing apparatus that can prevent an undesired reaction from being occurred on a thin film due to residual heat after a substrate processing is ended, stabilize the crystalline structure of the thin film, and decrease the damage of a transfer robot.

According to one aspect of the embodiment of the present disclosure, there is provided a method of manufacturing a semiconductor device, including: mounting a substrate on a substrate mounting member that is disposed in a reaction container; heating the substrate at a predetermined processing temperature and supplying a first gas and a second gas to the substrate to process the substrate; stopping supply of the first gas and the second gas, and supplying an inert gas into the reaction container; and unloading the substrate to outside the reaction container.

According to aspect of the another embodiment of the present disclosure, there is provided a substrate processing apparatus including: a reaction container configured to process a substrate; a rotatable substrate support member configured to support a plurality of the substrates on the same plane in the reaction container; a partition structure configured to partition an inside of the reaction container such that a first processing region, a first purge region, a second processing region, and a second purge region are sequentially arranged in a rotation direction of the substrate support member; a processing gas supply system configured to supply a first gas into the first processing region, and supply a second gas into the second processing region; an inert gas supply system configured to supply an inert gas into the first purge region and the second purge region; a heater configured to heat the substrate; an exhaust system configured to exhaust the inside of the reaction container; and a controller configured to control the substrate support member, the processing gas supply system, the inert gas supply system, the heater, and the exhaust system so as to process the substrates by heating each of the plurality of substrates with the heater, exhausting the inside of the reaction container with the exhaust system, supplying the first gas from the processing gas supply system into the first processing region, supplying the second gas from the processing gas supply system into the second processing region, supplying the inert gas from the inert gas supply system into the first purge region and second purge region, and rotating the substrate support member, and supply the inert gas from the inert gas supply system into the first purge region and the second purge region after the processing of the substrate is completed.

DETAILED DESCRIPTION

Figure 9:
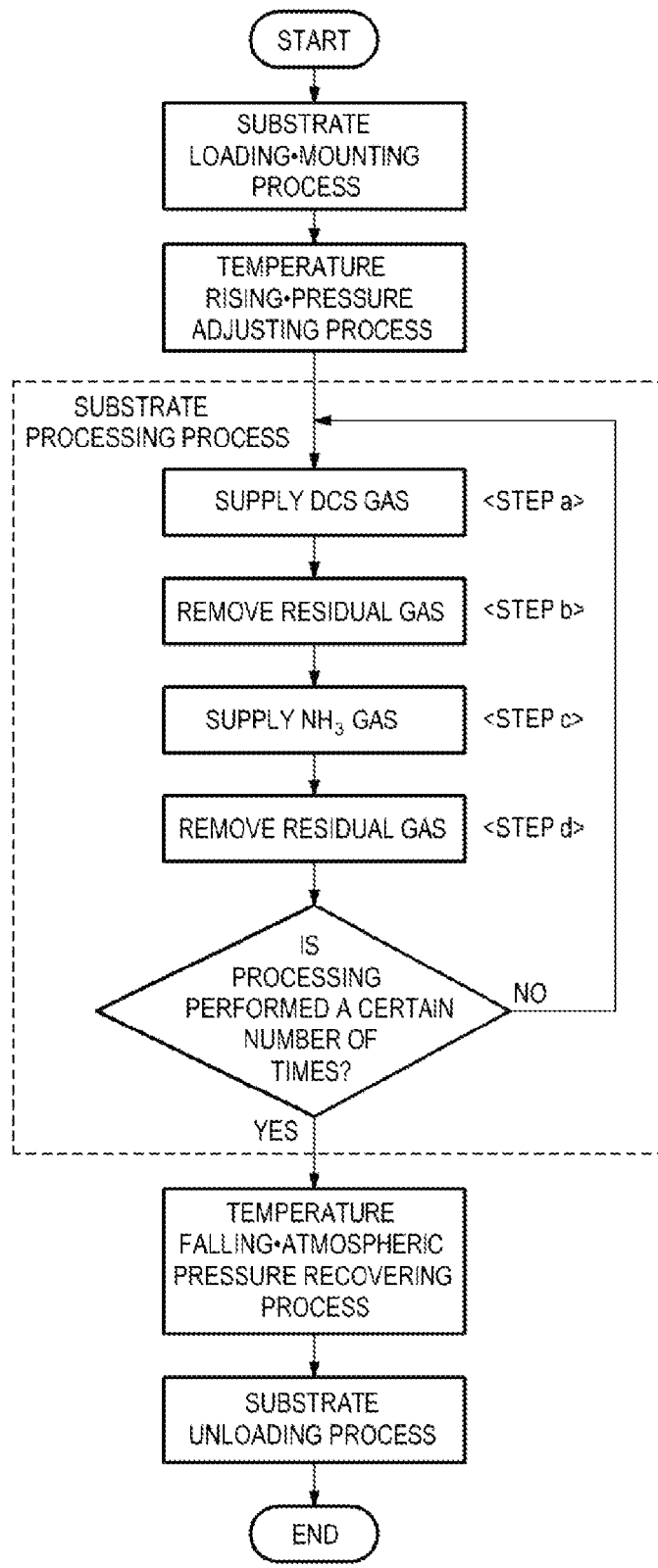
FIG. 9 is a flowchart illustrating a substrate processing process using a related art substrate processing apparatus.

A thin film (for example, a silicon nitride film) is formed on a substrate by alternately supplying various kinds of processing gases (i.e., dichlorosilane (DCS) gas or $NH_3$ gas), for example, by repeating four steps a to d of FIG. 9. That is, one cycle includes: (step a) supplying DCS gas into a reaction container with a substrate loaded therein; (step b) supplying an inert gas into the reaction container to purge the inside of the reaction container; (step c) supplying $NH_3$ gas into the reaction container; and (step d) supplying an inert gas into the reaction container to purge the inside of the reaction container. The cycle is repeated for a predetermined number of times to form a silicon nitride film on the substrate.

Generally, a long time is required for purging (step b and step d) the entire inside of the reaction container, and the cycle including steps a to d must be repeated several tens to hundreds of times for processing a substrate. Therefore, the substrate processing takes a long time, and thus, productivity is reduced. Also, when a number of types of gases used in processing the substrate increases, the number of steps included in one cycle also increases, and thus, a time taken for the substrate processing is prolonged. To increase productivity, it is required to supply or exhaust a gas at a high speed in each step, but it is difficult to increase productivity in such a method.

Moreover, when forming a thin film on a substrate in the above-described method, it is required to heat the substrate at a predetermined processing temperature (film formation temperature). A semiconductor device is usually manufactured through a plurality of processes. Therefore, for example, when a subsequent process is performed at a temperature higher than that of a previous process, a device structure that has been formed on the substrate in the previous process may be damaged, or the characteristic of a thin film that is formed on the substrate may be deformed. Accordingly, the temperature during a subsequent process generally is lower than that of a previous process. Also, it is anticipated that the size of a substrate to be processed will be changed from 300 mm, which is a size of the substrate mainly used at the present, to 450 mm. Heating the large substrate, which is supported by a pin susceptor having a small contact area, causes a heat sag of the large substrate. Thus, a demand for low-temperature processing is expected to increase.

However, when a film formation process is performed at a low temperature, a processing gas does not sufficiently react, and a foreign substance such as a product due to an incomplete reaction may be generated in the reaction container. When the foreign substance is attached to a substrate, the quality of a formed thin film may be degraded. For example, the foreign substance may deteriorate the uniformity or withstand voltage characteristics of the thin film. Therefore, to process a substrate at a low temperature, a research is required for decreasing the foreign substance. Also, a processing gas cannot sufficiently react at a low temperature, and thus, it may not be able to form a film on the substrate.

Moreover, when a substrate is unloaded from a reaction container immediately after a thin film is formed on the substrate in the above-described method, an undesired reaction (for example, oxidization, diffusion of impurities, the deformation of a crystalline structure, etc.) may be caused on the thin film. This is because the thin film formed on the substrate is maintained at a high temperature due to the residual heat of the substrate that is heated in forming the thin film. Also, in the substrate immediately after the film formation process is ended, since the crystalline structure of the formed thin film is not stabilized, residual impurities in a processing region are adulterated into the film, and thus, the quality of the film may be degraded. In addition, a transfer robot that unloads the substrate may be damaged by heat.

To increase productivity of the substrate processing, the inventors presented loading a plurality of substrates into a reaction container partitioned by a partition structure such that a plurality of processing regions and a plurality of purge regions equal to the number of processing regions are alternately arranged, mounting the substrates on the same plane by using a substrate support member, supplying a processing gas and an inert gas into the processing regions and the purge regions, and rotating the substrate support member to move the substrates inside the reaction container. The above-described steps a to d may be performed without purging (resetting) the entire inside of the reaction container, and thus, the productivity of the substrate processing can be increased.

Moreover, to reduce a temperature for a film formation process, the inventors presented alternately performing a process that supplies a first gas to a substrate while heating the substrate at a predetermined processing temperature and supplying a plasma-processed second gas to the substrate a predetermined times to thereby form a thin film on the substrate, and thus, the production of a foreign substance in forming a film may be reduced.

Furthermore, to reduce residual heat after forming a film, the inventors presented supplying an inert gas to a substrate to cool the processed substrate after a substrate processing is ended, and unloading the cooled substrate from inside a reaction container.

<Embodiment of the Present Disclosure>

Hereinafter, an embodiment of the present disclosure will be described in detail with reference to the accompanying drawings.

(1) Configuration of Substrate Processing Apparatus

Figure 1:
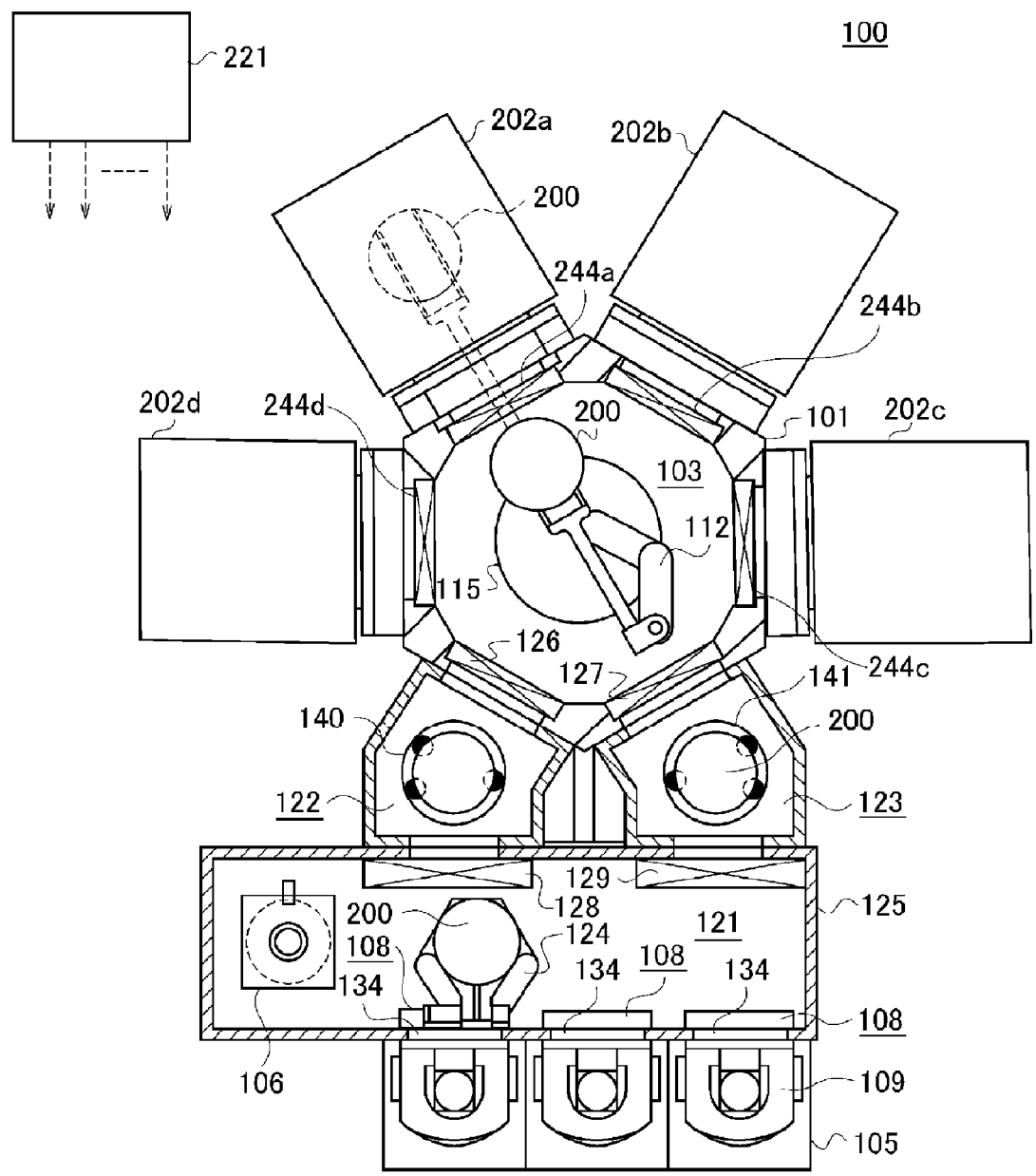
FIG. 1 is a cross-sectional view schematically illustrating a cluster type substrate processing apparatus according to an embodiment of the present disclosure.

FIG. 1 is a cross-sectional view illustrating a cluster type substrate processing apparatus according to an embodiment of the present disclosure. In the substrate processing apparatus, a front opening unified pod (FOUP) is used as a carrier that transfers a substrate such as a wafer 200. The cluster type substrate processing apparatus according to an embodiment of the present disclosure is divided into a vacuum side and an atmosphere side. In the specification, vacuum refers to an industrial vacuum. Also, for convenience of a description, a direction from a vacuum transfer chamber 103 to an atmosphere transfer chamber 121 is referred to as a front side.

(Configuration of Vacuum Side)

The cluster type substrate processing apparatus 100 includes a vacuum transfer chamber 103 as a first transfer chamber that is configured in a load lock chamber structure whose internal pressure may be reduced to less than an atmospheric pressure such as a vacuum state (for example, 100 Pa). A main body 101 of the vacuum transfer chamber 103 has, for example, a hexagonal shape when viewed from a plane, and has a box shape in which both a lower end and an upper end are closed.

Load lock chambers 122 and 123 that are connected to the vacuum transfer chamber 103 through gate valves 126 and 127 are installed in two side walls that are disposed in the front side among six side walls that form the main body 101 of the vacuum transfer chamber 103, respectively.

Process chambers 202a and 202b that are connected to the vacuum transfer chamber 103 through gate valves 244a and 244b are disposed in two side walls among the other four side walls of the vacuum transfer chamber 103, respectively.

A processing gas supply system, an inert gas supply system, and an exhaust system that will be described below are disposed in the process chambers 202a and 202b. In the process chambers 202a and 202b, as described below, a plurality of processing regions and a plurality of purge regions equal to the number of processing regions are alternately arranged in a reaction container. The wafer 200 as a substrate alternately passes through the processing region and the purge region by rotating a susceptor 217 that is disposed as a substrate support member in a reaction container 203 (see FIG. 2). With such a configuration, a processing gas and an inert gas are alternately supplied to the wafer 200, and a substrate processing is performed. Specifically, various substrate processing such as forming a thin film on the wafer 200, oxidizing, nitriding, and carbonizing a surface of the wafer 200, or etching the surface of the wafer 200, is performed.

Cooling chambers 202c and 202d that are connected to the vacuum transfer chamber 103 through gate valves 244c and 244d are disposed in the other two side walls of the vacuum transfer chamber 103, respectively.

A vacuum transfer robot 112 is disposed as a first transfer mechanism in the vacuum transfer chamber 103. The vacuum transfer robot 112, for example, may simultaneously transfer two wafers 200 (illustrated as a dot line in FIG. 1) between the load lock chambers 122 and 123, the process chambers 202a and 202b, and the cooling chambers 202c and 202d. The vacuum transfer robot 112 may ascend and descend while maintaining the sealability of the vacuum transfer chamber 103 by using an elevator 115. A wafer detection sensor (not shown) that detects whether the wafer 200 is disposed near each of the gate valves 126 and 127 of the load lock chambers 122 and 123, the gate valves 244a and 244b of the process chambers 202a and 202b, and the gate valves 244c and 244d of the cooling chambers 202c and 202d. The wafer detection sensor is also referred to as a substrate detection member.

Each of the load lock chambers 122 and 123 is configured in a load lock chamber structure whose internal pressure may be reduced to less than an atmospheric pressure such as a vacuum state. That is, an atmosphere transfer chamber 121 to be described below is disposed as a second transfer chamber through gate valves 128 and 129 in the front side of each of the load lock chambers 122 and 123. Therefore, the insides of the load lock chambers 122 and 123 are vacuum-exhausted by closing the gate valves 126 to 129, and then opening the gate valves 126 and 127. The wafer 200 is transferred between the load lock chambers 122 and 123 and the vacuum transfer chamber 103 while maintaining the vacuum state of the vacuum transfer chamber 103. Also, the load lock chambers 122 and 123 act as auxiliary chambers that temporarily receive the respective wafers 200 loaded into the vacuum transfer chamber 103. In this case, one wafer 200 is mounted on a substrate mounting member 140 in the load lock chamber 122, and the other wafer 200 is mounted on a substrate mounting member 141 in the load lock chamber 123.

(Configuration of Atmosphere Side)

The atmosphere transfer chamber 121 is disposed as a second transfer chamber, which is used under an approximate atmospheric pressure, in the atmosphere side of the substrate processing apparatus 100. That is, the atmosphere transfer chamber 121 is disposed through the gate valves 128 and 129 in a front side (a side opposite to the vacuum transfer chamber 103) of the load lock chambers 122 and 123. Also, the atmosphere transfer chamber 121 is disposed to be connected to the load lock chambers 122 and 123.

An atmosphere transfer robot 124, which moves and mounts the wafer 200, is disposed as a second transfer mechanism in the atmosphere transfer chamber 121. The atmosphere transfer robot 124 ascends and descends the wafer 200 by the elevator (not shown) that is disposed in the atmosphere transfer chamber 121, and shuttles the wafer 200 in a left and right direction by a linear actuator (not shown). Also, a wafer detection sensor (not shown) that detects whether the wafer 200 is disposed near the gate valves 128 and 129 of the atmosphere transfer chamber 121. The wafer detection sensor is also referred to as a substrate detection member.

Moreover, a notch adjustment device 106 configured to correct the position of the wafer 200, is disposed in the atmosphere transfer chamber 121. The notch adjustment device 106 determines the crystalline direction, the position alignment, or the like, of the wafer 200 with the notch of the wafer 200, and corrects the position of the wafer 200 based on the determined information. Also, instead of the notch adjustment device 106, an orientation flat adjustment device (not shown) may be disposed in the atmosphere transfer chamber 121. Furthermore, a clean unit (not shown) that supplies clean air may be disposed at an upper portion of the atmosphere transfer chamber 121.

A substrate transfer entrance 134, through which the wafer 200 is transferred to the inside or outside of the atmosphere transfer chamber 121, and a pod opener 108 are disposed in the front side of a main body 125 of the atmosphere transfer chamber 121. A load port 105 (input/output (I/O) stage) is disposed in a side opposite to the pod opener 108 (i.e., outside the main body 125) with the substrate transfer entrance 134 therebetween. A pod 109 that receives a plurality of wafers 200 is mounted on the load port 105. Also, a cover (not shown) that opens and closes the substrate transfer entrance 134, an opening and closing instrument (not shown) that opens and closes a cap of the pod 109, and an opening and closing instrument driving member (not shown) that drives the opening and closing instrument are disposed in the atmosphere transfer chamber 121. The pod opener 108 opens and closes the cap of the pod 109 mounted on the load port 105, and thus, enables the wafer 200 to be received or unloaded into or from the pod 109. Also, the pod 109 allows the wafer 200 to be loaded (supplied) and unloaded (discharged) into and from the load port 105 by a transfer device, for example a rail-guided vehicle (RGV, not shown).

The transfer mechanism of the substrate processing apparatus 100 according to an embodiment of the present disclosure is mainly configured with the vacuum transfer chamber 103, the load lock chambers 122 and 123, the atmosphere transfer chamber 121, and the gate valves 126 to 129.

Moreover, each component of the transfer mechanism of the substrate processing apparatus 100 is electrically connected to a controller 221. The controller 221 controls the operations of the above-described components.

(Operation of Transferring Wafer)

Next, an operation of transferring the wafer 200 in the substrate processing apparatus 100 according to an embodiment of the present disclosure will be described. An operation of each component of the transfer mechanism of the substrate processing apparatus 100 is controlled by the controller 221.

First, for example, the pod 109 with 25 unprocessed wafers 200 is received and loaded into the substrate processing apparatus 100 by a transfer device (not shown). The loaded pod 109 is mounted on the load port 105. The opening and closing instrument (not shown) opens the cap of the pod 109, the cover (not shown) of the substrate transfer entrance 134, and a wafer entrance of the pod 109.

When the wafer entrance of the pod 109 is opened, the atmosphere transfer robot 124 disposed in the atmosphere transfer chamber 121 picks up one wafer 200 from the pod 109, and mounts the one wafer 200 on the notch adjustment device 106.

The notch adjustment device 106 horizontally moves the mounted wafer 200 in a longitudinal and lateral direction (Y-axis and X-axis direction) and a circumferential direction, thereby adjusting the notch position of the wafer 200. While the notch adjustment device 106 is adjusting the position of a first wafer 200, the atmosphere transfer robot 124 picks up a second wafer 200 from the pod 109 and loads the second wafer 200 into the atmosphere transfer chamber 121. The second wafer 200 stands by in the atmosphere transfer chamber 121 until the adjusting the position of the first wafer 200 is completed.

When the notch adjustment device 106 completes the position adjustment of the first wafer 200, the atmosphere transfer robot 124 picks up the first wafer 200 on the notch adjustment device 106. At this time, the atmosphere transfer robot 124 mounts the second wafer 200, which is supported by the atmosphere transfer robot 124, on the notch adjustment device 106. Subsequently, the notch adjustment device 106 adjusts the notch position of the mounted second wafer 200.

Then, the gate valve 128 is opened, and the atmosphere transfer robot 124 transfers the first wafer 200 into the load lock chamber 122 and mounts the first wafer 200 on the substrate mounting member 140. During the above described transferring and mounting operations are performed, the gate valve 126 of the vacuum transfer chamber 103 side is closed, and thus, a decompressed atmosphere in the vacuum transfer chamber 103 is maintained. When transferring and mounting of the first wafer 200 onto the substrate mounting member 140 is completed, the gate valve 128 is closed, and the inside of the load lock chamber 122 is exhausted by an exhaust device (not shown) to reach a subatmospheric pressure.

Subsequently, the atmospheric transfer robot 124 repeats the above-described operation for each of the wafer 200 in the pod 109. However, when the load lock chamber 122 is in a decompression state, the atmosphere transfer robot 124 does not transfer the wafer 200 into the load lock chamber 122, and stops and stands by at a position immediately before the load lock chamber 122.

When a pressure in the load lock chamber 122 is reduced to a predetermined pressure (for example, 100 Pa), the gate valve 126 is opened such that the load lock chamber 122 may communicate with the vacuum transfer chamber 103. Subsequently, the vacuum transfer robot 112 disposed in the vacuum transfer chamber 103 picks up the first wafer 200 from the substrate mounting member 140 and loads the first wafer 200 into the vacuum transfer chamber 103.

After the vacuum transfer robot 112 picks up the first wafer 200 from the substrate mounting member 140, the gate valve 126 is closed, whereupon a pressure in the load lock chamber 122 returns to the atmospheric pressure and it is prepared to load a next wafer 200 into the load lock chamber 122. Simultaneously, the gate valve 244a of the process chamber 202a having a predetermined pressure (for example, 100 Pa) is opened, and the vacuum transfer robot 112 loads the first wafer 200 into the process chamber 202a. This operation is repeated until a predetermined number of wafers 200 (for example, five wafers) are loaded into the process chamber 202a. When loading of the predetermined number of wafers 200 (for example, five wafers) into the process chamber 202a is completed, the gate valve 244a is closed. Furthermore, a processing gas is supplied from the below-described gas supply unit into the process chamber 202a, and a predetermined processing of the wafers 200 is performed.

When the predetermined processing is completed in the process chamber 202a, the wafer 200 is cooled in the process chamber 202a, as described below, and the gate valve 244a is then opened. Then, the processed wafer 200 is unloaded from inside the process chamber 202a to the vacuum transfer chamber 103 by the vacuum transfer robot 112. After the processed wafer 200 is unloaded, the gate valve 244a is closed.

Subsequently, the gate valve 127 is opened, and the wafer 200 unloaded from the process chamber 202a is loaded into the load lock chamber 123 and mounted on the substrate mounting member 141. Also, a pressure in the load lock chamber 123 is reduced to a predetermined pressure by the exhaust device (not shown). The gate valve 127 is closed, and an inert gas is supplied from an inert gas supply unit (not shown) connected to the load lock chamber 123, whereupon the pressure in the load lock chamber 123 returns to the atmospheric pressure.

When the pressure in the load lock chamber 123 returns to the atmospheric pressure, the gate valve 129 is opened. Subsequently, the atmosphere transfer robot 124 picks up the processed wafer 200 from the substrate mounting member 141 and loads the wafer 200 into the atmosphere transfer chamber 121, and then the gate valve 129 is closed. Then, the atmosphere transfer robot 124 places the processed wafer 200 in the pod 109 by using the substrate transfer entrance 134 of the atmosphere transfer chamber 121. Here, the cap of the pod 109 may stay open until a maximum of 25 wafers 200 are loaded on the pod 109. The wafer 200 may be loaded on the pod 109 from which the wafer 200 is unloaded instead of an empty pod 109.

All wafers 200 inside the pod 109 are processed by performing the above-described operations. When all of the 25 processed wafers 200 are placed in the pod 109, the cap of the pod 109 and the cover (not shown) of the substrate transfer entrance 134 are closed by the opening and closing instrument (not shown). Subsequently, the pod 109 is transferred from the load port 105 to a next process by the transfer device (not shown). The above-described operations for processing the wafers 200 are repeated so that a plurality of wafers 200 (e.g., 25 wafers 200) are processed successively.

(2) Configuration of Process Chamber

Figure 2:
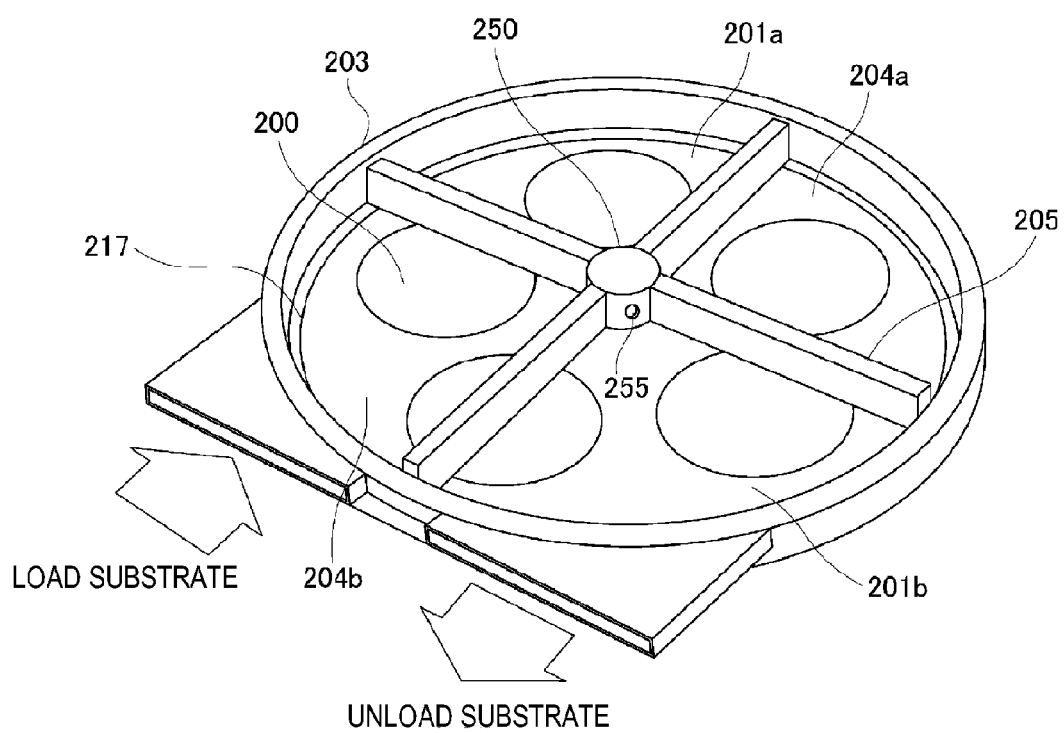
FIG. 2 is a perspective view schematically illustrating a reaction container according to an embodiment of the present disclosure.
Figure 3:
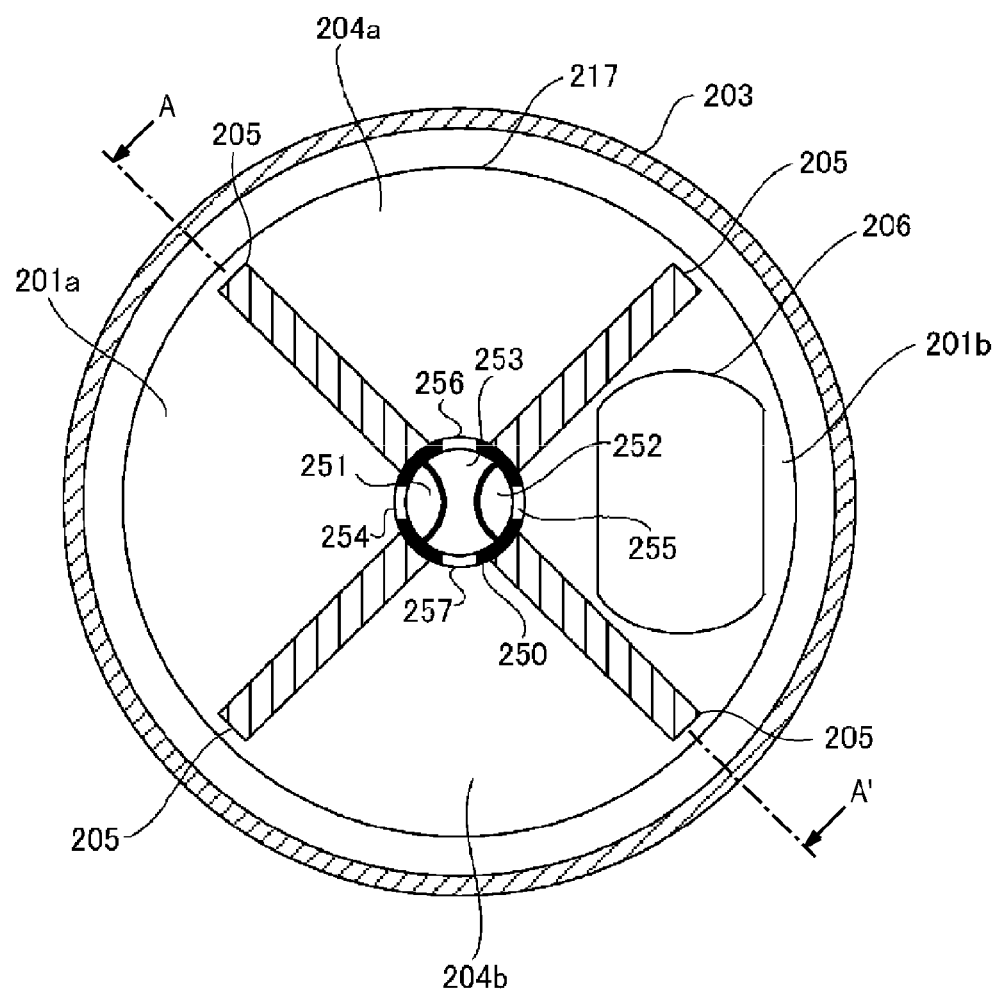
FIG. 3 is a cross-sectional view schematically illustrating a processing furnace according to an embodiment of the present disclosure.
Figure 4:
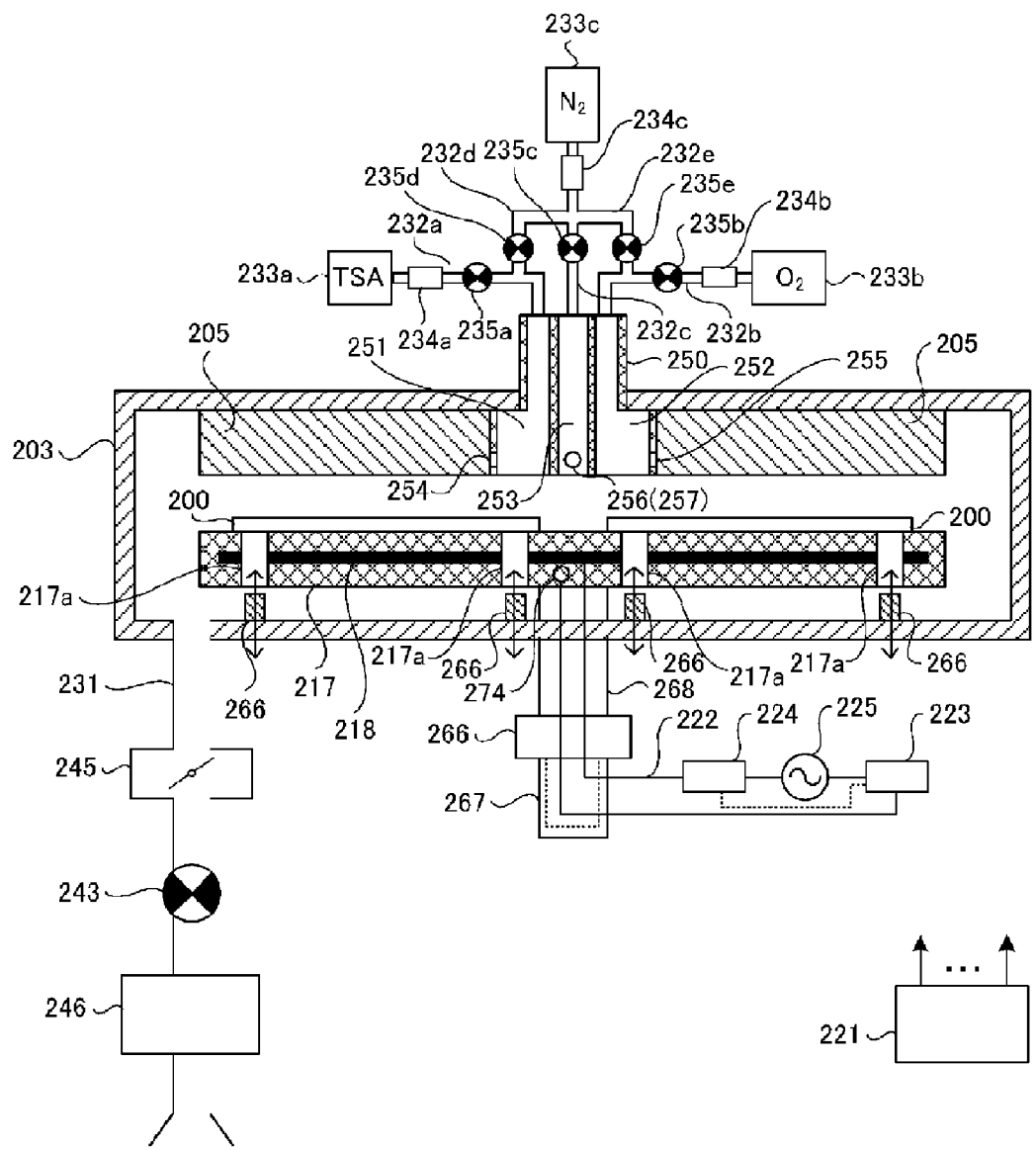
FIG. 4 is a longitudinal sectional view schematically illustrating the processing furnace according to an embodiment of the present disclosure, and is a A-A' line sectional view of the processing furnace of FIG. 3.

The configuration of the process chamber 202a as a processing furnace according to an embodiment of the present disclosure will be described with reference to FIGS. 2 to 4. FIG. 2 is a perspective view schematically illustrating a reaction container according to an embodiment of the present disclosure. In FIG. 2, a lid that covers an upper end of the reaction container is not illustrated for convenient reference of the internal structure of the reaction container. FIG. 3 is a cross-sectional view schematically illustrating a processing furnace according to an embodiment of the present disclosure. FIG. 4 is a longitudinal sectional view schematically illustrating the processing furnace according to an embodiment of the present disclosure, and is a A-A' line sectional view of the processing furnace of FIG. 3. Also, the process chamber 202b is configured similarly to the process chamber 202a, and thus, a description on the process chamber 202b is not provided.

(Reaction Container)

As illustrated in FIGS. 2 to 4, the process chamber 202a as the processing furnace includes the reaction container 203, a cylindrical sealing container. A processing space for the wafer 200 is formed in the reaction container 203. Four partition plates 205, which are extended in a radial direction from the central portion of the reaction container 203, are disposed at an upper side of the processing space in the reaction container 203. The four partition plates 205 partition the processing space in the reaction container 203 into a first processing region 201a, a first purge region 204a, a second processing region 201b, and a second purge region 204b. That is, each of the four partition plates 205 is used as a partition structure that partitions the inside of the reaction container 203 into the first processing region 201a, the first purge region 204a, the second processing region 201b, and the second purge region 204b. Also, the first processing region 201a, the first purge region 204a, the second processing region 201b, and the second purge region 204b are arranged in this order along the rotation direction of the below-described susceptor 217. Further, a processing region and a purge region are alternately arranged.

As described below, by rotating the susceptor 217, a wafer 200 mounted on the susceptor 217 is moved through the first processing region 201a, the first purge region 204a, the second processing region 201b, and the second purge region 204b. Also, as described below, a first processing gas is supplied as a first gas into the first processing region 201a, a second processing gas is supplied as a second gas into the second processing region 201b, and an inert gas is supplied into the first and second purge regions 204a and 204b. Therefore, by rotating the susceptor 217, the first processing gas, the inert gas, the second processing gas, and the inert gas are supplied to the wafer 200 in this order. The configuration of the susceptor 217 and the configuration of the gas supply system will be described below.

A gap having a predetermined width is formed between an end portion of the partition plate 205 and a side wall of the reaction container 203, and a gas passes through the gap. The inert gas is jetted from inside the first and second purge regions 204a and 204b into the first and second processing regions 201a and 201b through the gap. Therefore, the processing gas is prevented from being penetrated into the first and second purge regions 204a and 204b, and thus, the reaction of the processing gas is prevented, or a foreign substance is prevented from being produced by the reaction.

Moreover, in an embodiment of the present disclosure, an angle between adjacent partition plates 205 is 90 degrees, but the present disclosure is not limited thereto. That is, in consideration of a time that is taken in supplying various gases to the wafer 200, for example, an angle between two partition plates 205 forming the second processing region 201b may be relatively greater, or may be appropriately changed.

(Susceptor)

As illustrated in FIGS. 2 to 4, the susceptor 217 is disposed at a lower side of the reaction container 203 below the partition plate 205. The susceptor 217 is rotatable about a rotation axis that is located at the center of the reaction container 203. The susceptor 217 is also referred to as a substrate support member. The susceptor 217, for example, may be formed of a nonmetal material such as aluminum nitride (AlN), ceramics, or quartz, in order to reduce the metal pollution of the wafer 200. Also, the susceptor 217 is electrically insulated from the reaction container 203.

The susceptor 217 supports a plurality of wafers 200 (for example, five wafers in the present embodiment) on the same plane, in the reaction container 203. Here, the same plane is not limited to the completely same plane. For example, when viewed from a top of the susceptor 217, as illustrated in FIGS. 2 and 3, the plurality of wafers 200 may be arranged not to be overlapped with each other.

Also, a circle-shaped concave portion (not shown) may be formed at the support position of the wafer 200, in a surface of the susceptor 217. The concave portion may be formed to have a diameter slightly greater than that of the wafer 200. By disposing the wafer 200 in the concave portion, the position of the wafer 200 can be easily determined. Also, when the susceptor 217 rotates, a centrifugal force is applied to the wafer 200. However, due to the wafer 200 disposed in the concave portion, even if the centrifugal force is applied to the wafer 200, the deviation of the position of the wafer 200 will be prevented.

As illustrated in FIG. 4, an elevating instrument 268 that lifts and lowers the susceptor 217 is disposed in the susceptor 217. A plurality of through holes 217a is formed in the susceptor 217. A plurality of wafer lift pins 266 is disposed at a bottom of the reaction container 203. When the wafer 200 is loaded into or unloaded from the reaction container 203, the wafer lift pins 266 lift the wafer 200 and support a backside of the wafer 200. The through holes 217a and the wafer lift pins 266 are arranged such that the wafer lift pins 266 pass through the respective through holes 217a without contacting the susceptor 217 when the wafer lift pins 266 is elevated or the susceptor 217 is lowered by the elevating instrument 268.

A rotation instrument 267 for rotating the susceptor 217 is disposed in the elevating instrument 268. A rotation axis (not shown) of the rotation instrument 267 is connected to the susceptor 217, and thus, the susceptor 217 rotates by driving the rotation instrument 267. The below-described controller 221 is connected to the rotation instrument 267 through a coupling member (not shown). The coupling member is a slip ring instrument that electrically connects a rotation axis and a fixed axis by using a metal brush. Therefore, the rotation of the susceptor 217 is not disturbed. The controller 221 controls an electrical connection to the rotation instrument 267 such that the susceptor 217 rotates at a predetermined speed for a predetermined time. As described above, by rotating the susceptor 217, a wafer 200 mounted on the susceptor 217 sequentially moves through the first processing region 201a, the first purge region 204a, the second processing region 201b, and the second purge region 204b.

(Heating Unit)

A heater 218, a heating unit, is buried integratedly in the susceptor 217 to heat the wafer 200. When power is supplied to the heater 218, a surface of the wafer 200 is heated to a predetermined temperature (for example, a room temperature to about 1000 degrees C.). Also, a plurality of the heaters 218 may be disposed on the same plane so as to respectively heat a plurality of wafers 200 mounted on the susceptor 217.

A temperature sensor 274 is disposed in the susceptor 217. The heater 218 and the temperature sensor 274 are electrically connected to a temperature adjustor 223, a power adjustor 224, and a heater power source 225, through a power supply line 222. An electrical connection to the heater 218 is controlled on the basis of temperature information that is detected by the temperature sensor 274.

(Gas Supply Unit)

A gas supply unit 250, which includes a first processing gas introduction part 251, a second processing gas introduction part 252, and an inert gas introduction part 253, is disposed in an upper side of the reaction container 203. The gas supply unit 250 is air-tightly disposed at an opening that is formed in the upper side of the reaction container 203. A first ejection hole 254 is disposed in a side wall of the first processing gas introduction part 251. A second ejection hole 255 is disposed in a side wall of the second processing gas introduction part 252. A first inert ejection hole 256 and a second inert ejection hole 257 are disposed to face each other in a side wall of the inert gas introduction part 253. The gas supply unit 250 supplies a first processing gas into the first processing region 201a through the first processing gas introduction part 251, a second processing gas into the second processing region 201b through the second processing gas introduction part 252, and an inert gas into the first and second purge regions 204a and 204b through the inert gas introduction part 253. The gas supply unit 250 may separately supply the first and second gases and the inert gas without mixing the first and second gases and the inert gas. Also, the gas supply unit 250 may supply the first and second gases and the inert gas in parallel.

(Processing Gas Supply System)

A first gas supply pipe 232a is connected to an upstream side of the first processing gas introduction part 251. A raw material gas supply source 233a, a main flow controller (MFC) 243a that is a flow rate controller (flow rate control member), and a valve 235a, an opening and closing valve, are disposed in this order from an upstream side of the first gas supply pipe 232a.

The first gas (first processing gas) such as a silicon-containing gas is supplied from the first gas supply pipe 232a into the first processing region 201a through the MFC 234a, the valve 235a, the first processing gas introduction part 251, and the first ejection hole 254. The silicon-containing gas such as trisilylamine (($SiH_3$)$_3$N, TSA) gas may also be used as the first processing gas. Also, the first processing gas may be one of solid, liquid, and gas at a room temperature and a normal pressure, and will be described as the first processing gas herein. When the first processing gas is liquid at the room temperature under the normal pressure, a vaporizer (not shown) may be disposed between the raw material gas supply source 233a and the MFC 234a.

Moreover, hexamethyldisilazane ($C_6H_{19}NSi_2$, HMDS) gas that is an organic silicon material may also be used as the silicon-containing gas.

A second gas supply pipe 232b is connected to an upstream side of the second processing gas introduction part 252. A raw material gas supply source 233b, an MFC 243b that is a flow rate controller (flow rate control member), and a valve 235b, an opening and closing valve, are disposed in this order from an upstream side of the second gas supply pipe 232b.

The second gas (second processing gas) such as oxygen ($O_2$) gas, which is an oxygen-containing gas, is supplied from the second gas supply pipe 232b into the second processing region 201b through the MFC 234b, the valve 235b, the second processing gas introduction part 252, and the second ejection hole 255. The oxygen gas is changed into a plasma state by a plasma generating unit 206, and supplied to a wafer 200. Also, the oxygen gas may adjust a temperature of the heater 218 and a pressure in the reaction container 203 to within a predetermined range, as the oxygen gas is activated with heat. Moreover, ozone ($O_3$) gas or vapor ($H_2O$) gas may also be used as the oxygen-containing gas.

A first processing gas supply system (silicon-containing gas supply system) is mainly configured with the first gas supply pipe 232a, the MFC 234a, and the valve 235a. Also, the first processing gas supply system may include the raw material gas supply source 233a, the first processing gas introduction part 251, and the first ejection hole 254. Also, a second processing gas supply system (oxygen-containing gas supply system) is mainly configured with the second gas supply pipe 232b, the MFC 234b, and the valve 235b. Also, the second processing gas supply system may include the raw material gas supply source 233b, the second processing gas introduction part 252, and the second ejection hole 255. Furthermore, the processing gas supply system is mainly configured with the first processing gas supply system and the second processing gas supply system.

(Inert Gas Supply System)

A first inert gas supply pipe 232c is connected to an upstream side of the inert gas introduction part 253. An inert gas supply source 233c, an MFC 243c that is a flow rate controller (flow rate control member), and a valve 235c, an opening and closing valve, are disposed in this order from an upstream side of the first inert gas supply pipe 232c.

The inert gas such as nitrogen ($N_2$) gas is supplied from the first inert gas supply pipe 232c into the first and second purge regions 204a and 204b through the MFC 234c, the valve 235c, the inert gas introduction part 253, the first inert ejection hole 256, and the second inert ejection hole 257. The inert gas that is supplied into the first and second purge regions 204a and 204b acts as a purge gas in the below-described film forming process S30. Also, the inert gas acts as a cooling gas in a substrate cooling process S40 that is performed after a film is formed. Also, a rare gas such as He gas, Ne gas, or Ar gas may also be used as the inert gas.

A downstream end of a second inert gas supply pipe 232d is connected to a downstream side than the valve 235a of the first gas supply pipe 232a. An upstream end of the second inert gas supply pipe 232d is connected between the MFC 234c and valve 235c of the first inert gas supply system. A valve 235d that is an opening valve is disposed in the second inert gas supply pipe 232d.

The inert gas such as $N_2$ gas is supplied from the second inert gas supply pipe 232d into the first processing region 201a through the MFC 234c, the valve 235d, the first gas supply pipe 232a, the first processing gas introduction part 251, and the first ejection hole 254. The inert gas that is supplied into the first processing region 201a is used as a carrier gas or a diluent gas in the film forming process S30. Also, the inert gas is used as a cooling gas in the substrate cooling process S40 performed after a film is formed.

A downstream end of a third inert gas supply pipe 232e is connected to a downstream side than the valve 235b of the second gas supply pipe 232b. An upstream end of the third inert gas supply pipe 232e is connected between the MFC 234c and valve 235c of the first inert gas supply system. A valve 235e that is an opening valve is disposed in the third inert gas supply pipe 232e.

The inert gas such as $N_2$ gas is supplied from the third inert gas supply pipe 232e into the second processing region 201b through the MFC 234c, the valve 235e, the second gas supply pipe 232b, the second processing gas introduction part 252, and the second ejection hole 255. The inert gas that is supplied into the second processing region 201b is used as a carrier gas or a diluent gas in the film forming process S30, similarly to the inert gas that is supplied into the first processing region 201a. Also, the inert gas is used as a cooling gas in the substrate cooling process S40 that is performed after a film is formed.

A first inert gas supply system is mainly configured with the first inert gas supply pipe 232c, the MFC 234c, and the valve 235c. Also, the first inert gas supply system may include the inert gas supply source 233c, the inert gas introduction part 253, the first inert ejection hole 256, and the second inert ejection hole 257. Also, a second inert gas supply system is mainly configured with the second inert gas supply pipe 232d and the valve 235d. Also, the second inert gas supply system may include the inert gas supply source 233c, the MFC 234c, the first gas supply pipe 232a, the first processing gas introduction part 251, and the first ejection hole 254. Also, a third inert gas supply system is mainly configured with the third inert gas supply pipe 232e and the valve 235e. Also, the third inert gas supply system may include the inert gas supply source 233c, the MFC 234c, the second gas supply pipe 232b, the second processing gas introduction part 252, and the second ejection hole 255. Furthermore, the inert gas supply system is mainly configured with the first to third inert gas supply systems.

(Plasma Generating Unit)

Figure 5:
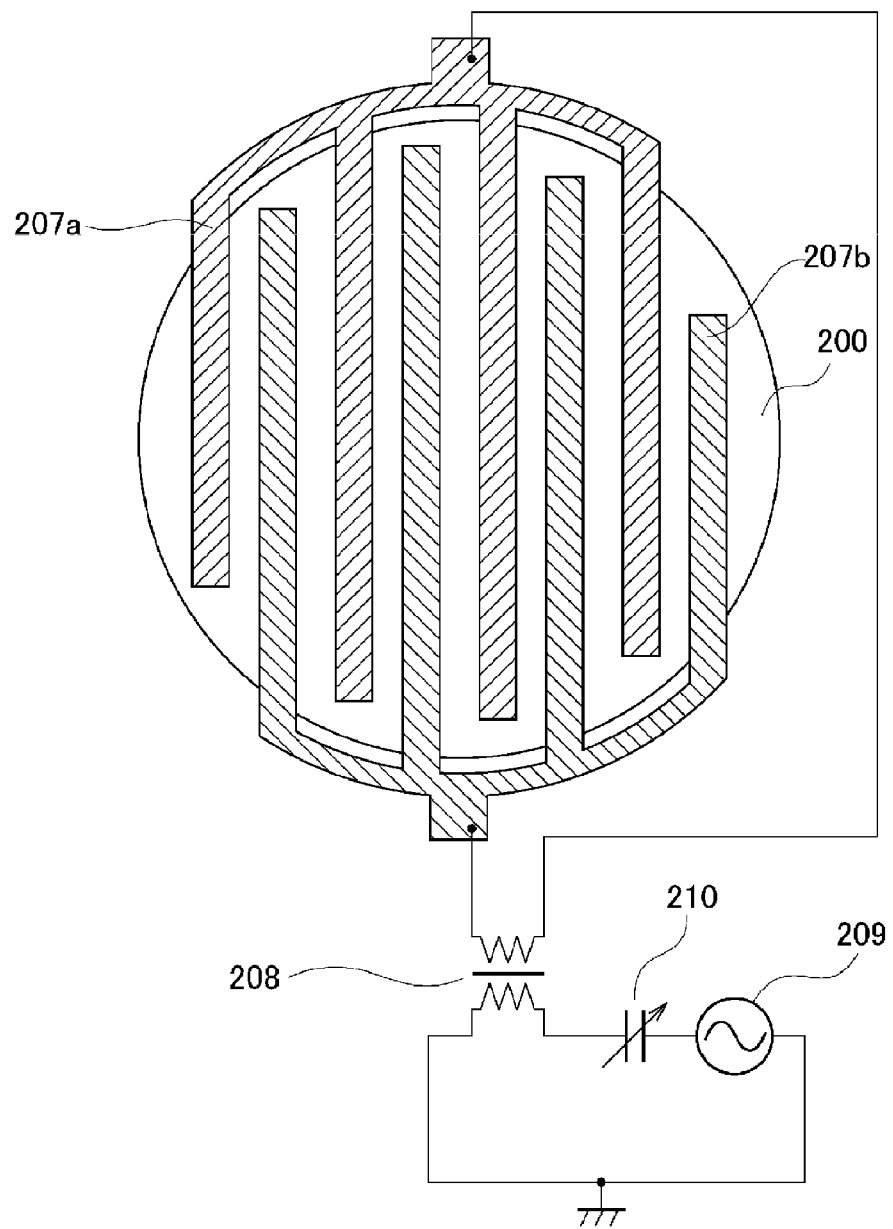
FIG. 5 is a schematic configuration diagram illustrating comb-shaped electrodes as a plasma generating unit that changes a processing gas, which is supplied from a processing gas supply system, into a plasma gas, according to an embodiment of the present disclosure.

As illustrated in FIG. 3, a plasma generating unit 206 that changes a supplied processing gas into a plasma state is disposed in an upper side of the second processing region 201b. By changing the processing gas into the plasma state, a wafer 200 may be processed at a low temperature. The plasma generating unit 206, as illustrated in FIG. 5, includes at least one pair of comb-shaped electrodes 207a and 207b facing each other. A secondary side output of an insulation transformer 208 is electrically connected to the comb-shaped electrodes 207a and 207b. When alternating current (AC) power outputted from the high-frequency power source 209 is supplied to the comb-shaped electrodes 207a and 207b through a matcher 210, plasma is generated near the comb-shaped electrodes 207a and 207b.

The comb-shaped electrodes 207a and 207b are disposed to face a processing surface of the wafer 200 supported by the susceptor 217. It is preferable that the comb-shaped electrodes 207a and 207b are disposed to be spaced apart from the processing surface of the wafer 200 at a distance of 5 mm to 25 mm. In this way, when the comb-shaped electrodes 207a and 207b are disposed near the processing surface of the wafer 200, an activated processing gas can be prevented from being devitalized before reaching the wafer 200.

In the comb-shaped electrodes 207a and 207b, the number of electrodes, the width of each electrode, and an interval between the electrodes may be appropriately changed depending on the processing conditions. Also, the configuration of the plasma generating unit 206 is not limited to the above-described configuration in which the comb-shaped electrodes 207a and 207b are disposed in the second processing region 201b. That is, if the plasma generating unit 206 is capable of supplying plasma to the processing surface of the wafer 200 supported by the susceptor 217, the configuration of the plasma generating unit 206 is not limited, and the plasma generating unit 206 may be a remote plasma instrument that is included in the processing gas supply system. When the remote plasma instrument is used, the second processing region 201b may become smaller.

(Exhaust System)

As illustrated in FIG. 4, an exhaust pipe 231 that exhausts the atmosphere in the processing regions 201a and 201b and the atmosphere in the purge regions 204a and 204b is disposed in the reaction container 203. A vacuum pump 246 which is a vacuum exhaust device is connected to the exhaust pipe 231 through a pressure sensor 245 (which is a pressure detector (pressure detection member) and detects a pressure (in the processing regions 201a and 201b and the purge regions 204a and 204b) in the reaction container 203 and an auto pressure controller (APC) valve 243 which is a pressure adjustor (pressure adjustment member). Thus, the pressure in the reaction container 203 may be vacuum-exhausted to a predetermined pressure (degree of vacuum). Also, by opening or closing the APC valve 243, it is possible to perform or stop the vacuum-exhaust operations at the inside of the reaction container 203. Furthermore, the APC valve 243 adjusts a pressure by changing the degree of the valve's opening. The exhaust system is mainly configured with the exhaust pipe 231, the APC valve 243, and the pressure sensor 245. Also, the vacuum pump 246 may be included in the exhaust system.

(Control Unit)

Figure 6:
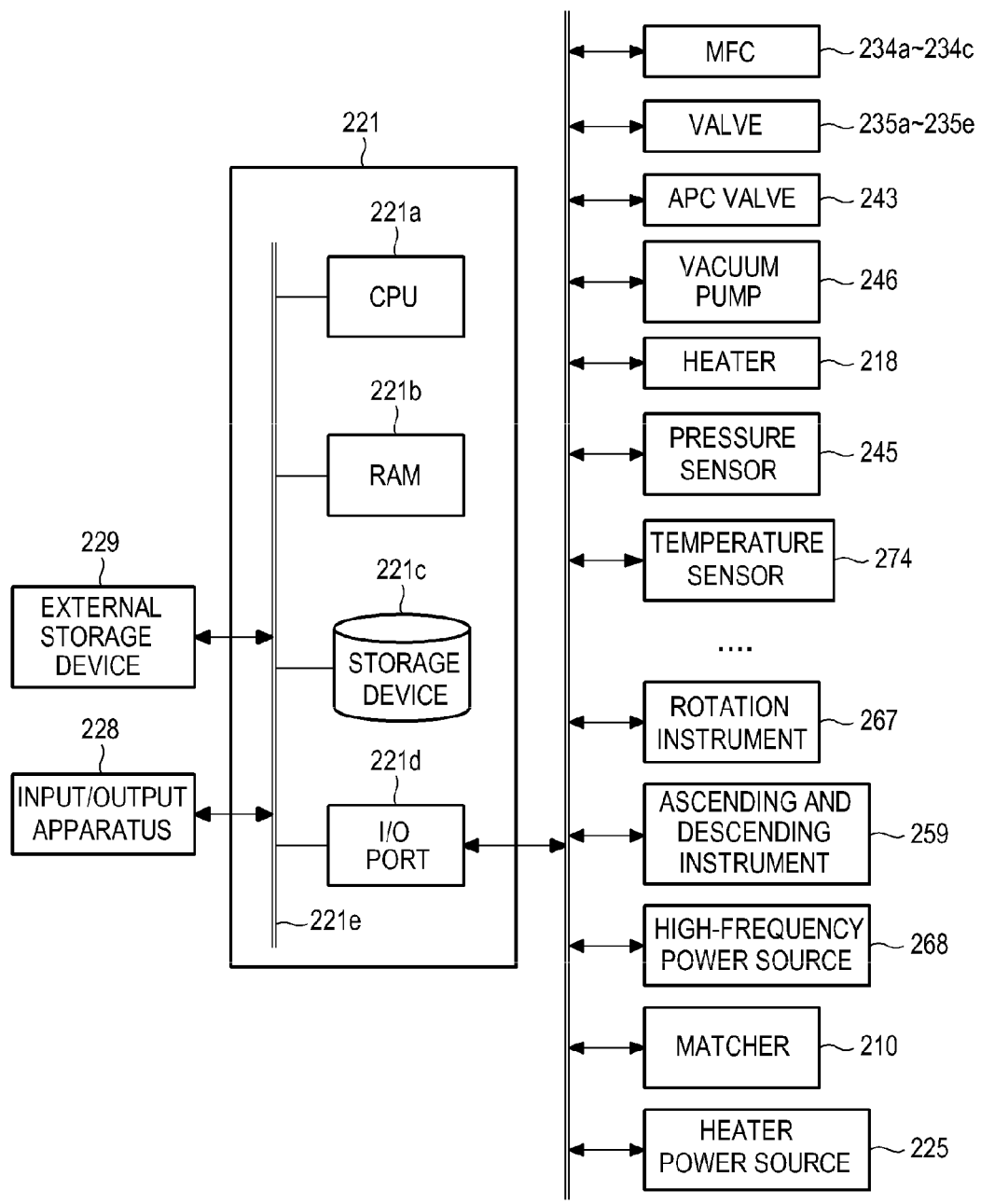
FIG. 6 is a block diagram schematically illustrating a controller of a substrate processing apparatus which is used in an embodiment of the present disclosure.

As illustrated in FIG. 6, the controller 221 that is the control unit (control means) is configured with a computer that includes a central processing unit (CPU) 221a, a random access memory (RAM) 221b, a storage device 221c, and an I/O port 221d. The RAM 221b, the storage device 221c, and the I/O port 221d may be configured so as to enable the exchange of data with the CPU 221a through an internal bus 221e. For example, the controller 221 is connected to an input/output device 228 that is configured with a touch panel or the like.

The storage device 221c, for example, may be configured with a flash memory, a hard disk drive (HDD), etc. A control program that controls the operation of the substrate processing apparatus 100, or a process method (a process recipe) in which the below-described procedure or a condition of substrate processing is recorded is stored to be readable in the storage device 221c. Also, the process methods may be combined to obtain a predetermined result by executing each procedure of the above-described substrate processing process in the controller 221, and acts as a program. Hereinafter, the process method, a control program or the like is simply referred to as a program. Also, the term "program" may include a case in which the program includes only a process method group, a case in which the program includes only a control program group, or a case in which the program includes both the process method group and the control program group. Also, the RAM 221b includes a memory area (work area) that temporarily stores a program or data that is read by the CPU 221a.

The I/O port 221d is connected to the above-described MFCs 234a to 234c, valves 235a to 235e, pressure sensor 245, APC valve 243, vacuum pump 246, heater 218, temperature sensor 274, rotation instrument 267, elevating g instrument 268, high-frequency power source 209, matcher 210, and heater power source 225.

The CPU 221a reads the control program and the process method from the storage device 221c according to the input of a manipulation command from the input/output device 228. Furthermore, the CPU 221a controls operations (which are performed by the MFCs 234a to 234c) of adjusting the flow rates of various gases, the opening and closing operations of the valves 235a to 235e, the opening and closing operation of the APC valve 243, the pressure adjustment operation of the APC valve 243 based on the pressure sensor 245, the temperature adjustment operation of the heater 218 based on the temperature sensor 274, the start and stop of the vacuum pump 246, the rotation speed adjustment operation of the rotation instrument 267, the ascending and descending operation of the elevating instrument 268, the power supply of the high-frequency power source 209, and the power supply of the heater power source 225 according to the contents of the read process method, or performs an impedance control of the matcher 210.

Moreover, the controller 221 is not limited as being configured with a dedicated computer, and may be configured with a general computer. For example, the controller 221 according to an embodiment of the present disclosure may be configured by preparing an external storage device 229 (for example, a magnetic tape, a magnetic disk such as a flexible disk or a hard disk, an optical disk such as a CD or a DVD, a magneto-optical disk such as an MO, or a semiconductor memory such as a USB memory or a memory card) that stores the above-described program and installing the program in a general computer with the relevant external storage device 229. Also, a system for supplying a program to a computer is not limited to a case that supplies the program through the external storage device 229. For example, a program may be supplied using a communication system such as Internet or a dedicated line, without using the external storage device 229. Also, the storage device 221c or the external storage device 229 is configured as a non-transitory computer-readable recording medium. Hereinafter, each of the storage elements is simply referred to as a recording medium. Also, the term "recording medium" may include a case in which the recording medium includes only the storage device 221c group, a case in which the recording medium includes only the external storage device 229 group, or a case in which the recording medium includes both the storage device 221c group and the external storage device 229 group.

(3) Substrate Processing Process

Figure 7:
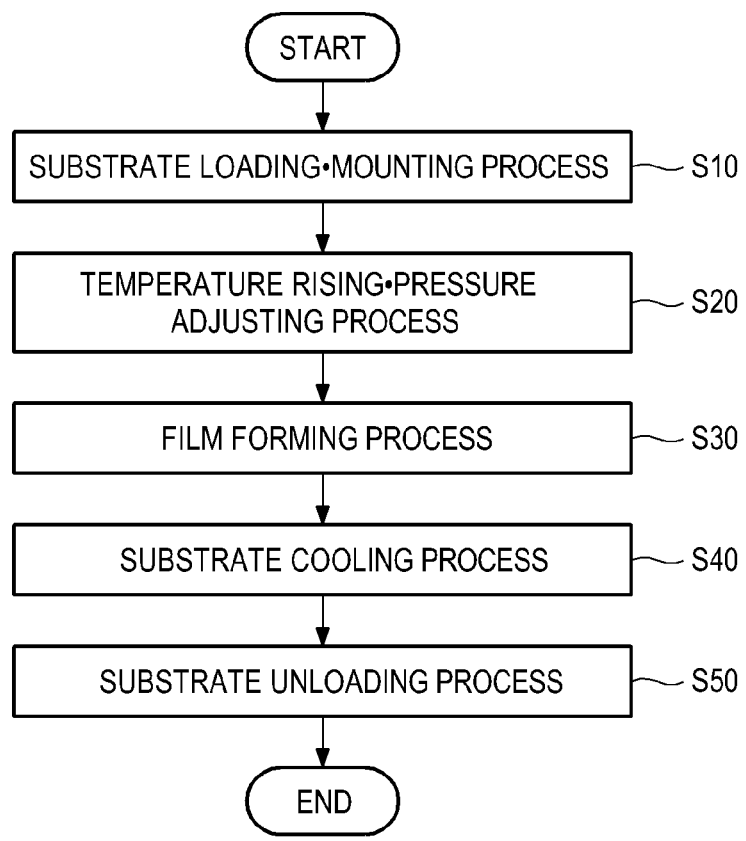
FIG. 7 is a flowchart illustrating a substrate processing process according to an embodiment of the present disclosure.
Figure 8:
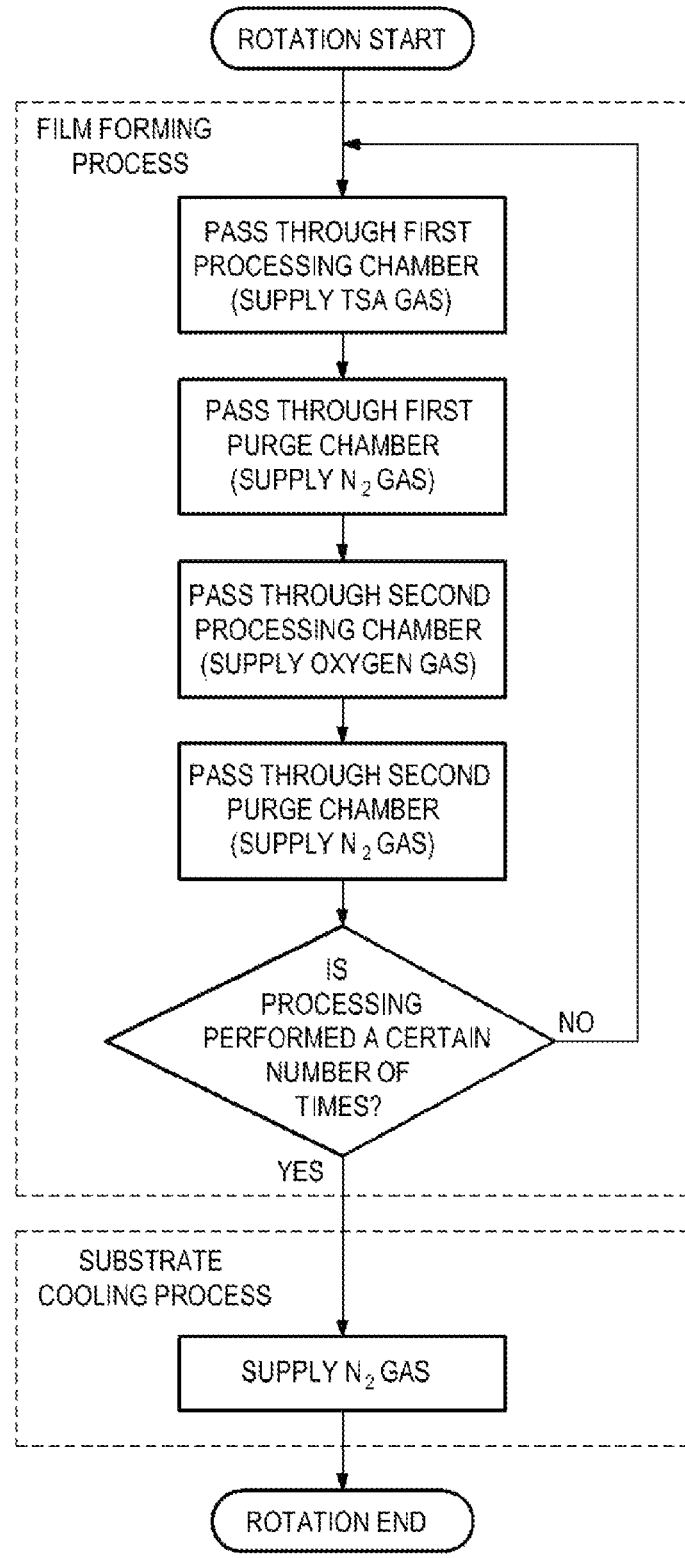
FIG. 8 is a flowchart illustrating a substrate processing process and a substrate cooling process according to an embodiment of the present disclosure.

As one process of a semiconductor device manufacturing method according to an embodiment of the present disclosure, a substrate processing process that is performed using the process chamber 202a including the above-described reaction container 203 will be described with reference to FIGS. 7 and 8. FIG. 7 is a flowchart illustrating a substrate processing process according to an embodiment of the present disclosure. FIG. 8 is a flowchart illustrating a substrate processing operation in a film forming process and a substrate cooling process in the substrate processing process according to an embodiment of the present disclosure. Also, in the following description, the operation of each component of the process chamber 202a of the substrate processing apparatus 100 is controlled by the controller 221.

The following description will be made on an example that forms a SiO film (Silicon Oxide film) as an insulation film on a wafer 200 by using the TSA gas (which is a silicon-containing gas) as a first processing gas and using the oxygen gas (which is an oxygen-containing gas) as a second processing gas.

(Substrate Loading and Mounting Process S10)

First, the wafer lift pin 266 ascends to the transfer position of the wafer 200, and the wafer lift pin 266 passes through the through hole 217a of the susceptor 217. As a result, the wafer lift pin 266 protrudes from the surface of the susceptor 217 by a predetermined height. Subsequently, the gate valve 244a is opened, and a predetermined number of wafers 200 (for example, five wafers) are loaded into the reaction container 203 by using the vacuum transfer robot 112. The wafers 200 are mounted about a rotation axis (not shown) of the susceptor 217 not to be overlapped with each other, on the same plane. Therefore, each of the wafers 200 is horizontally supported on the wafer lift pin 266 that protrudes from the surface of the susceptor 217.

When the wafers 200 are loaded into the reaction container 203, the vacuum transfer robot 112 moves outside the reaction container 203, and then, the reaction container 203 is closed by closing the gate valve 244a. Subsequently, by lowering the wafer lift pins 266, the respective wafers 200 are mounted on the susceptor 217, in respective lower portions of the first processing region 201a, the first purge region 204a, the second processing region 201b, and the second purge region 204b.

Moreover, when loading the wafers 200 into the reaction container 203, the inert gas supply system may supply $N_2$ gas (which is a purge gas) into the reaction container 203 while the exhaust unit exhausts the inside of the reaction container 203. Specifically, the inside of the reaction container 203 is exhausted by driving the vacuum pump 246 and opening the APC valve 243. Simultaneously, $N_2$ gas is supplied into the reaction container 203 by at least opening the valve 235c of the first inert gas supply system. Therefore, particles can be prevented from being penetrated into the processing region 201, or from being adhered to the wafers 200. Here, the second inert gas supply system and the third inert gas supply system may supply an inert gas. Also, the vacuum pump 246 continuously maintains an operation state until the substrate loading and mounting process S10 to the below-described substrate loading process S50 are ended.

(Temperature Rising and Pressure Adjusting Process S20)

Power is supplied to the heater 218 that is buried in the susceptor 217, and the surface of each of the wafers 200 is heated to a predetermined temperature (for example, 200 degrees C. to 400 degrees C.). At this time, the temperature of the heater 218 is adjusted by controlling an electrical connection to the heater 218 according to temperature information detected by the temperature sensor 274.

Moreover, in heating the wafer 200 formed of silicon, when the surface temperature of the wafer 200 is heated to more than 750 degrees C., impurities are diffused into a source region or a drain region that is formed at the surface of the wafer 200, circuit characteristic is degraded, and the performance of a semiconductor device is reduced. By restricting the temperature of the wafer 200 as described above, impurities can be prevented from being diffused into a source region or a drain region that is formed at the surface of the wafer 200, the degradation of the circuit characteristic can be prevented, and the performance of a semiconductor device can be improved.

Moreover, the vacuum pump 246 vacuum-exhausts the inside of the reaction container 203 such that a pressure in the reaction container 203 becomes a desired pressure (for example, 0.1 Pa to 300 Pa, and preferably, 20 Pa to 40 Pa). At this time, the pressure in the reaction container 203 is measured by a pressure sensor (not shown), and the degree of the opening of the APC valve 243 is feedback-controlled on the basis of the measured pressure information.

Moreover, the rotation of the susceptor 217 is started by driving the rotation instrument 267 while heating the wafer 200. At this time, the rotation speed of the susceptor 217 is controlled by the controller 221. The rotation speed of the susceptor 217, for example, may be one rotation/sec. Also, the susceptor 217 continuously maintains a rotation state until the below-described substrate cooling process S40 is ended. By rotating the susceptor 217, the wafer 200 is moved through the first processing region 201a, the first purge region 204a, the second processing region 201b, and the second purge region 204b, and thus passes through the regions, sequentially.

(Film Forming Process S30)

The following description will be made on an example of a process that forms a SiO film on the wafer 200 by supplying TSA gas as the first processing gas into the first processing region 201a and supplying oxygen gas as the second processing gas into the second processing region 201b. Also, in the following description, the supply of TSA gas, the supply of oxygen gas, and the supply of the inert gas are simultaneously performed.

When the wafer 200 is heated to reach a desired temperature and the susceptor 217 reaches a desired rotation speed, the valves 235a to 235c are opened, and a processing gas and an inert gas are supplied to the processing regions 201a and 201b and the purge regions 204a and 204b. Specifically, TSA gas is supplied into the first processing region 201a by opening the valve 235a, and oxygen gas is simultaneously supplied into the second processing region 201b by opening the valve 235b. Furthermore, $N_2$ gas that is an inert gas is supplied into the first purge regions 204a and the second purge region 204b by opening the valve 235c. At this time, for example, by appropriately adjusting the APC valve 243, a pressure in the reaction container 203 becomes a pressure within a range of 10 Pa to 1,000 Pa. The temperature of the heater 218, for example, is set to maintain the temperature of the wafer 200 to be within a range of 200 degrees C. to 400 degrees C.

When the valve 235a is opened, TSA gas is supplied from the first gas supply pipe 232a to the first processing region 201a through the first processing gas introduction part 251 and the first ejection hole 254, and is exhausted from the exhaust pipe 231. At this time, the MFC 234a controls the flow rate of TSA gas to be within a predetermined range. Also, for example, the MFC 234a controls the supply flow rate of TSA gas to be within a range of 100 sccm to 5,000 sccm.

When supplying TSA gas into the first processing region 201a, the valve 235d is opened, and $N_2$ gas may be supplied as a carrier gas or a diluent gas from the second inert gas supply pipe 232d into the first processing region 201a. Therefore, the supply of TSA gas into the first processing region 201a can be facilitated.

Moreover, when the valve 235a and the valve 235b are opened, oxygen gas is supplied from the second gas supply pipe 232b to the second processing region 201b through the second processing gas introduction part 252 and the second ejection hole 255, and is exhausted from the exhaust pipe 231. At this time, the MFC 234b controls the flow rate of oxygen gas to be within a predetermined range. Also, for example, the MFC 234b controls the supply flow rate of oxygen gas to be within a range of 1000 sccm to 10,000 sccm.

When supplying oxygen gas into the second processing region 201b, the valve 235e is opened, and $N_2$ gas may be supplied as a carrier gas or a diluent gas from the third inert gas supply pipe 232e into the second processing region 201b. Therefore, the supply of oxygen gas into the second processing region 201b can be facilitated.

Moreover, when the valves 235a to 235c are opened, $N_2$ gas (which is an inert gas as a purge gas) is supplied from the first inert gas supply pipe 232c to the first and second purge regions 204a and 204b through the inert gas introduction part 253, the first inert ejection hole 256, and the second inert ejection hole 257, and is exhausted. At this time, the MFC 234c controls the flow rate of $N_2$ gas to be within a predetermined range. Also, an inert gas is ejected in a direction from the first and second purge regions 204a and 204b to the first and second processing regions 201a and 201b, through a gap between the end portion of the partition plate 205 and the side wall of the reaction container 203. Therefore, a processing gas can be prevented from being penetrated into the first and second purge regions 204a and 204b.

When a gas supply is started, the high-frequency power source 209 simultaneously supplies high-frequency power to the electrodes 207a and 207b of the plasma generating unit 206 that is disposed in an upper side of the second processing region 201b. Oxygen gas, which is supplied into the second processing region 201b and passes through a portion under the plasma generating unit 206, is changed into a plasma state in the second processing region 201b, and thus, active species are supplied to the wafer 200. Also, high-frequency power is supplied from the high-frequency power source 209 to the pair of comb-shaped electrodes 207a and 207b. The high-frequency power may be within a range of 50 W to 1,000 W, for example.

Oxygen gas has a high reaction temperature, and it is difficult for oxygen gas to react under the processing temperature of the wafer 200 and the pressure in the reaction container 203 as described above. However, as in the present embodiment, when oxygen gas is changed into a plasma state, the processing of film formation may be performed even at a temperature, for example, lower than or equal to 400 degrees C. by supplying active species included in the plasma gas. Also, when a processing temperature required in the first processing gas differs from that required in the second processing gas, the heater 218 may be controlled based on a lower temperature of the processing temperatures of the first and second processing gases, and the other processing gas that requires a relatively higher processing temperature may be changed into a plasma state and supplied. As such, the wafer 200 may be processed at a low temperature by using the plasma state of the processing gas. By processing the wafer 200 at a low temperature, the wafer 200 (having an aluminum wiring vulnerable to heat) can be prevented from being damaged due to heat. Also, the production of a foreign substance such as a product material due to the incomplete reaction of a processing gas can be prevented, and the uniformity or withstand voltage characteristic of a thin film that is formed on the wafer 200 can be enhanced. Also, due to the high oxidizing power of plasma-processed oxygen gas, an oxidization processing time can be shortened, and the productivity of substrate processing can be increased.

As described above, by rotating the susceptor 217, the wafer 200 is repeatedly moved through the first processing region 201a, the first purge region 204a, the second processing region 201b, and the second purge region 204b, in this order. Therefore, as illustrated in FIG. 8, the supply of TSA gas, the supply (purge) of $N_2$ gas, the supply of plasma-processed oxygen gas, and the supply (purge) of $N_2$ gas are alternately performed to the wafer 200 a predetermined number of times.

First, TSA gas is supplied to the surface of the wafer 200 that passes through the first processing region 201a, and a silicon-containing layer is formed on the wafer 200.

Subsequently, the wafer 200 with the silicon-containing layer formed thereon passes through the first purge region 204a. At this time, $N_2$ gas as an inert gas is supplied to the wafer 200.

Subsequently, oxygen gas is supplied to the wafer 200 that passes through the second processing region 201b, and a silicon oxide (SiO) layer is formed on the wafer 200. That is, oxygen gas reacts with at least one portion of the silicon-containing layer that is formed on the wafer 200, in the first processing region 201a. Therefore, the silicon-containing layer is oxidized and thus modified into a SiO layer including silicon and oxygen.

The wafer 200, on which the SiO layer has been formed in the second processing region 201b, passes through the second purge region 204b. At this time, $N_2$ gas as an inert gas is supplied to the wafer 200.

In this way, a SiO film may be formed with one rotation of the susceptor 217 as one cycle. That is, in one cycle, the wafer 200 has passed through the first processing region 201a, the first purge region 204a, the second processing region 201b, and the second purge region 204b. Thus, by performing the cycle at least one time or more, a SiO film having a predetermined film thickness may be formed on the wafer 200.

A SiO film having a desired film thickness is formed on the wafer 200, and then, at least the valves 234a and 235b are closed, and the supply of TSA gas and oxygen gas is stopped to the first and second processing regions 201a and 201b. At this time, the supply of power to the comb-shaped electrodes 207a and 207b is also stopped. In addition, a temperature is lowered or the supply of power to the heater 218 is stopped by controlling the electrical flow amount of the heater 218. Also, when the flow rate of each of TSA gas and oxygen gas is a flow rate by which the SiO film is not formed on the wafer 200, TSA gas and oxygen gas may be continuously supplied to the first and second processing regions 201a and 201b, thus enhancing productivity.

(Substrate Cooling Process S40)

As illustrated in FIGS. 7 and 8, after the above-described film forming process S30 is ended, the wafer 200 is mounted on the susceptor 217, and $N_2$ gas is supplied as a cooling gas to the first and second purge regions 204a and 204b. Therefore, the processed wafer 200 with the SiO film formed thereon is cooled.

In this case, by closing the valves 235a and 235b, the supply of TSA gas and oxygen gas is stopped. The valve 235c is opened, and gas (whose a flow rate has been controlled by the MFC 234c) is supplied from the first inert gas supply pipe 232c to the first and second purge regions 204a and 204b, and is exhausted. At this time, as described above, the rotation of the susceptor 217 is continuously performed. Therefore, the consumption of TSA gas or oxygen gas is suppressed, or the production of a byproduct material due to the reaction of TSA gas and oxygen gas is suppressed, and the processed wafer 200 with the SiO film formed thereon can be quickly cooled.

At this time, the valves 235a and 235e may be opened, and $N_2$ gas may be supplied as a cooling gas from the second and third inert gas supply pipes 232d and 232e into the first and second processing regions 201a and 201b. Therefore, the processed wafer 200 can be more quickly cooled.

In this way, by supplying an inert gas ($N_2$ gas) as a cooling gas, the processed wafer 200 can be quickly cooled in the reaction container 203. Furthermore, after the film forming process S30 is completed, the occurrence of an undesired reaction can be prevented on the wafer 200 with a thin film formed thereon. That is, by quickly cooling the processed wafer 200 (on which the thin film has been formed) from the thin film side with an inert gas, the rising of a temperature in the thin film due to residual heat accumulated in the wafer 200 can be prevented. Accordingly, the occurrence of an undesired reaction can be prevented on the thin film of the wafer 200 in which the processing of film formation is completed, and the reduction in the film quality of the wafer 200 can be prevented. Here, for example, the undesired reaction denotes that the atmosphere in the reaction container 203 reacts with the film formed on the wafer 200 due to residual heat.

Moreover, by quickly cooling the processed wafer 200, the crystalline structure of the thin film formed on the wafer 200 can be rapidly stabilized. Therefore, a processing gas that is left in the first and second processing regions 201a and 201b or an unnecessary byproduct material that is produced in the reaction container 203 can be prevented from being penetrated into the thin film formed on the wafer 200. Therefore, the reduction in the film quality of the wafer 200 can be better prevented.

Furthermore, in the below-described substrate unloading process S50, when the wafer 200 is unloaded from the reaction container 203, each component of the vacuum transfer robot 112 can be prevented from being damaged by heat of the wafer 200. Also, the heat resistance required for the components can be lowered.

(Substrate Unloading Process S50)

The wafer lift pin 266 ascends, and the wafer 200 is supported on the wafer lift pin 266 that protrudes from the surface of the susceptor 217. Furthermore, the gate valve 244a is opened, and the vacuum transfer robot 112 unloads the wafer 200 to outside the reaction container 203, whereupon the substrate processing process according to an embodiment of the present disclosure is completed. Also, in the above description, conditions such as the temperature of the wafer 200, a pressure in the reaction container 203, the flow rate of each gas, power applied to the electrodes 207a and 207b, and a processing time, are appropriately adjusted based on the material or thickness of a film to be formed.

(4) Effects of the Present Embodiment

According to the present embodiment, one or more effects will now be described.

(a) According to the present embodiment, the reaction container 203 is partitioned into the first processing region 201a, the first purge region 204a, the second processing region 201b, and the second purge region 204b to be alternately arranged. Furthermore, by rotating the susceptor 217, the wafer 200 is moved through the first processing region 201a, the first purge region 204a, the second processing region 201b, and the second purge region 204b, in this order. Accordingly, a processing gas and an inert gas can be alternately supplied to the wafer 200 without entirely purging (resetting) the inside of the reaction container 203. As a result, the productivity of substrate processing can be enhanced.

(b) In the present embodiment, the processed wafer 200 is quickly cooled in the reaction container 203. Accordingly, the rising of a temperature in the thin film due to residual heat accumulated in the wafer 200 can be prevented. By preventing the rising of a temperature, the occurrence of an undesired reaction can be prevented on the thin film formed on the wafer 200, and the deterioration of the film quality of the wafer 200 can be prevented.

(c) In the present embodiment, the processed wafer 200 is quickly cooled in the reaction container 203. Accordingly, the crystalline structure of the thin film formed on the wafer 200 can be rapidly stabilized. By rapidly stabilizing the crystalline structure of the thin film, an unnecessary byproduct material that is produced in the reaction container 203 can be prevented from being penetrated into the thin film formed on the wafer 200. Therefore, the reduction in the quality of the thin film formed on the wafer 200 can be better prevented. Also, in the above-described embodiments, a case in which the SiO film is formed on the wafer 200 has been described. On the other hand, if the film formed on the wafer 200 is a high-k film, the thin film formed on the wafer 200 can be more rapidly stabilized.

(d) In the present embodiment, the processed wafer 200 is quickly cooled in the reaction container 203. Accordingly, for example, the damage of the vacuum transfer robot 112 that unloads the wafer 200 from the reaction container can be reduced, and the damage of each member that is used in a process after the substrate processing process can be reduced. Also, heat resistance required for each member that is used in a process after the substrate processing process can be lowered.

(e) In the present embodiment, after the processing of film formation is ended on the wafer 200, an inert gas is supplied into the purge regions 204a and 204b and the processing regions 201a and 201b, and the processed wafer 200 is cooled. Accordingly, the processed wafer 200 can be more quickly cooled.

(f) In the present embodiment, the plasma generating unit 206 is disposed in the second processing region 201b that changes a processing gas into a plasma state. Thus, the processing of the wafer 200 may be performed at a low temperature. Accordingly, the production of a foreign substance such as a product material due to the incomplete reaction of a processing gas can be prevented, and thus, the uniformity or withstand voltage characteristic of a thin film that is formed on a substrate can be enhanced. Also, due to a plasma-processed processing gas, a processing time can be shortened, thus enhancing productivity.

(g) In the present embodiment, the plasma generating unit 206 includes the pair of comb-shaped electrodes 207a and 207b, which are disposed to face the processing surface of the wafer 200 at a position of 5 mm to 25 mm from the processing surface of the wafer 200 supported by the susceptor 217. Accordingly, the devitalization of an activated processing gas can be prevented, and the activated processing gas can be efficiently supplied to the wafer 200.

<Another Embodiment of the Present Disclosure>

An embodiment of the present disclosure has been described in detail, but the present disclosure is not limited to the above-described embodiment. The present disclosure may be variously modified within the scope that does not deviate from the subject matters of the present disclosure.

For example, in the above-described embodiment, two processing regions and two purge regions are formed in the reaction container 203. However, three or more processing regions and purge regions may be formed in the reaction container 203, and three or more kinds of gases may be supplied to each of the processing regions. For example, when three processing regions and three purge regions are formed in the reaction container 203, a silicon-containing gas is used as a first processing gas, an oxygen-containing gas is used as a second processing gas, and a nitrogen-containing gas (for example, ammonia ($NH_3$)) is used as a third processing gas, thereby forming a silicon oxynitride (SiON) film on a wafer 200. This embodiment of the present disclosure has the same effects as those of the above-described embodiments.

Moreover, in the above-described embodiment, the partition plate 205 is used as a partition structure that partitions the inside of the reaction container 203 into the first processing region 201a, the first purge region 204a, the second processing region 201b, and the second purge region 204b, but is not limited thereto. For example, the partition structure may be formed by forming a convex portion at a ceiling that forms a processing space in the reaction container 203.

Moreover, in the above-described embodiment, each angle between the partition plates 205 is 90 degrees, the volume of each of the processing regions 201a and 201b and the purge regions 204a and 204b is constant, and a time that is taken in passing the wafer 200 through each region (i.e., a time for which the wafer 200 is exposed to the atmosphere in each region) is constant. However, the preset disclosure is not limited thereto. For example, the volume of each of the processing regions 201a and 201b and the volume of each of the purge regions 204a and 204b may be changed according to the kinds of gases that are used in substrate processing. That is, by appropriately changing an angle between the partition structures (partition plates 205), the volumes of the respective regions may become different, and a time for which the wafer 200 is exposed to the atmosphere in the first processing region 201a may differ from a time for which the wafer 200 is exposed to the atmosphere in the second processing region 201b.

Moreover, in the above-described embodiment, the SiO film is formed on the wafer 200 by using a silicon-containing gas and an oxygen-containing gas as processing gases. However, the present disclosure is not limited thereto. That is, for example, high-k films such as a hafnium oxide (HfO) film, a zirconium oxide (ZrO) film, and a titanium oxide (TiO) film, may be formed by using a hafnium (He-containing gas and an oxygen-containing gas, a zirconium (Zr)-containing gas and an oxygen-containing gas, and a titanium (Ti)-containing gas and an oxygen-containing gas. Also, in addition to an oxygen-containing gas, an ammonia (NH3)-containing gas that is a nitrogen (N)-containing gas may be used as a processing gas that is changed into a plasma state.

Moreover, in the above-described embodiment, the susceptor 217 rotates when cooling the processed wafer 200. However, the present disclosure is not limited thereto. As another example, the rotation of the susceptor 217 may be stopped when cooling the processed wafer 200. Also, when the rotation of the susceptor 217 is stopped, the processed wafer 200 can be quickly cooled by supplying a large amount of inert gas to the processed wafer 200.

Moreover, in the above-described embodiment, the inert gas introduction part 253 of the gas supply unit 250 is commonly used for the first and second purge regions 204a and 204b, but a plurality of inert gas introduction parts may be separately provided.

Moreover, in the above-described embodiment, a load inlet and an unload outlet for the wafer 200 are separately provided, but one opening may be commonly used as a load inlet and an unload outlet for the wafer 200.

Moreover, in the above-described embodiment, the wafer lift pin 266 ascends and thus moves the wafer 200 to a processing position or a transfer position, but by lifting and lowering the susceptor 217, the wafer 200 may be moved to the processing position or the transfer position.

Moreover, in the above-described embodiment, a case in which the process chamber 202a is used as a processing furnace and the processed wafer 200 is cooled in the process chamber 202a has been described as an example, but the present embodiment is not limited thereto.

That is, even when the process chamber 202b is used as the process furnace, a similar operation is performed. Also, the process chambers 202a and 202b may perform the same processing, or perform different processings. Furthermore, for example, in a case where the process chambers 202a and 202b perform different processes, the process chamber 202a may perform a certain process on the wafer 200, and then the process chamber 202b may perform another process on the wafer 200. Also, in a case where the process chamber 202a performs a certain process on the wafer 200 and then the process chamber 202b performs another process on the wafer 200, the wafer 200 may pass through the load lock chamber 122 or the load lock chamber 123. Also, in the present embodiment, four process chambers 202a to 202d are provided, but the number of provided process chambers may be three or less, or five or more.

Moreover, the processed wafer 200 may be cooled in the process chambers 202a and 202b, and then the processed wafer 200 may be further cooled in a plurality of cooling chambers 202c and 202d. That is, after cooling is ended in the process chambers 202a and 202b, the processed wafer 200 may pass through the vacuum transfer chamber 103 by the vacuum transfer robot 112, and may be transferred into and mounted on the cooling chambers 202c and 202d whose pressure has been adjusted to a predetermined pressure (for example, 100 Pa or 1 Pa or less). At this time, when an inert gas is supplied with a predetermined flow rate (for example, 1 slm) into the cooling chambers 202c and 202d, the processed wafer 200 can be more quickly cooled. After a predetermined time elapses, the processed wafer 200 is unloaded from the cooling chambers 202c and 202d by the vacuum transfer robot 112. Also, the cooling chambers 202c and 202d may have a stack structure so as to overcome the restriction of the operation range of the vacuum transfer robot 112 and dispose many wafers 200 in a small space. Furthermore, a stand in each of the cooling chambers 202c and 202d may have an instrument that moves upward and downward, in order to dispose more wafers 200.

Also, the processed wafer 200 may be cooled in the process chambers 202a and 202b, or in the process chambers 202a and 202b and the cooling chambers 202c and 202d, and then the processed wafer 200 may be further cooled in the load lock chambers 122 and 123. That is, the load lock chambers 122 and 123 may be used as cooling chambers that temporarily receive and cool the wafer 200 which has been unloaded from the vacuum transfer chamber 103 and cooled in the process chambers 202a and 202b. Also, although not shown, a partition wall plate (middle plate) may be formed in the load lock chambers 122 and 123. Therefore, the cooling of the wafer 200 can be prevented from being disturbed by heat interference. That is, for example, when a plurality of processed wafers 200 are loaded into the load lock chambers 122 and 123, the cooling speed of a first-loaded processed wafer 200 can be prevented from being slowed in spite of the heat of a next-loaded processed wafer 200.

In the above-described present embodiment, a case in which the load lock chamber 122 is used as an auxiliary chamber for load and the load lock chamber 123 is used as an auxiliary chamber for unload has been described as an example. However, the present embodiment is not limited thereto. That is, the load lock chamber 122 may be used as an auxiliary chamber for unload, and the load lock chamber 123 may be used as an auxiliary chamber for load. Furthermore, the load lock chambers 122 and 123 may be commonly used for load and unload. Here, when the gate valve 128 or 129 of the atmosphere side is opened without taking a sufficient cooling time, the load lock chambers 122 and 123 or electric parts connected near the load lock chambers 122 and 123 can be damaged due to the radiant heat of the wafer 200. Due to this reason, when cooling a high-temperature processed wafer 200, for example, the load lock chamber 122 may be used as an auxiliary chamber for load, and the load lock chamber 123 may be used as an auxiliary chamber for unload. Therefore, while the processed wafer 200 has been loaded into the load lock chamber 123 and is being cooled, the gate valves 126 and 128 of the load lock chamber 122 may be opened and closed, and thus, another wafer 200 may be loaded into a process chamber to be processed.

<Additional Aspects of the Present Disclosure>

Hereinafter, some aspects of the present disclosure will be additionally stated.

A first aspect of the present disclosure may provide a method of manufacturing a semiconductor device includes: mounting a substrate on a substrate mounting member that is disposed in a reaction container having a plurality of processing regions including a first processing region and a second processing region; heating the substrate at a predetermined processing temperature, supplying a first gas into the first processing region, supplying a plasma-processed second gas into the second processing region, and passing the substrate through the first processing region and the second processing region to thereby form a thin film on the substrate; stopping supply of the first gas and the second gas into the reaction container, and supplying an inert gas into the reaction container to cool the processed substrate; and unloading the cooled substrate to outside the reaction container.

Another aspect of the present disclosure provides a substrate processing apparatus including: a reaction container configured to process a substrate; a rotatable substrate support member configured to support a plurality of the substrates on the same plane in the reaction container; a partition structure configured to partition an inside of the reaction container such that a first processing region, a first purge region, a second processing region, and a second purge region are sequentially arranged in a rotation direction of the substrate support member; a processing gas supply system configured to supply a first gas into the first processing region, and supply a second gas into the second processing region; an inert gas supply system configured to supply an inert gas into the first purge region and the second purge region; a heater configured to heat the substrate; an exhaust system configured to exhaust the inside of the reaction container; and a controller configured to control the substrate support member, the processing gas supply system, the inert gas supply system, the heater, and the exhaust system so as to process the substrates by heating each of the plurality of substrates with the heater, exhausting the inside of the reaction container with the exhaust system, supplying the first gas from the processing gas supply system into the first processing region, supplying the second gas from the processing gas supply system into the second processing region, supplying the inert gas from the inert gas supply system into the first purge region and second purge region, and rotating the substrate support member, and supply the inert gas from the inert gas supply system into the first purge region and the second purge region after the processing of the substrate is completed.

In some embodiments, after the thin film is formed, by supplying the inert gas into the first processing region and the second processing region, the processed substrate may be cooled.

In some embodiments, the process of cooling the processed substrate may include rotating the substrate support member.

In some embodiments, the process of cooling the processed substrate may include supplying the inert gas into the processing region.

In some embodiments, the plasma generating unit may include a pair of comb-shaped electrodes, and the comb-shaped electrodes may be disposed to face a processing surface of the substrate at a position of 5 mm to 25 mm from the processing surface of the substrate supported by the substrate support member.

In some embodiments, trisilylamine (TSA) gas that is a silicon-containing gas may be used as the first gas, and oxygen gas that is an oxygen-containing gas may be used as the second gas.

Another aspect of the present disclosure provides a method of manufacturing a semiconductor device including: loading a plurality of substrates into a reaction container, and mounting the plurality of substrates on the same plane on a substrate support member that is disposed in the reaction container, an inside of the reaction container being partitioned by a partition structure such that a first processing region, a first purge region, a second processing region, and a second purge region are sequentially arranged; processing the substrates by heating the substrate with a heater, exhausting the processing regions and the purge regions with an exhaust system, supplying the processing gas from a processing gas supply system into the processing regions, supplying the inert gas from an inert gas supply system into the purge regions, and rotating the substrate support member to alternately move the substrate between the processing regions and the purge regions in order to alternately supply the processing gas and the inert gas to the substrate; cooling the processed substrate, after the processing of the substrate is ended, by supplying the inert gas from the inert gas supply system into the purge region; and unloading the cooled substrate from the inside the reaction container.

Another aspect of the present disclosure provides a program includes: mounting a substrate on a substrate mounting member that is disposed in a reaction container having a plurality of processing regions including a first processing region and a second processing region; heating the substrate at a predetermined processing temperature, supplying a first gas into the first processing region, supplying a plasma-processed second gas into the second processing region, and passing the substrate through the first processing region and the second processing region to thereby form a thin film on the substrate; stopping supply of the first gas and the second gas into the reaction container, and supplying an inert gas into the reaction container to cool the processed substrate; and unloading the cooled substrate to outside the reaction container.

Another aspect of the present disclosure provides a recording medium includes: mounting a substrate on a substrate mounting member that is disposed in a reaction container having a plurality of processing regions including a first processing region and a second processing region; heating the substrate at a predetermined processing temperature, supplying a first gas into the first processing region, supplying a plasma-processed second gas into the second processing region, and passing the substrate through the first processing region and the second processing region to thereby form a thin film on the substrate; stopping supply of the first gas and the second gas into the reaction container, and supplying an inert gas into the reaction container to cool the processed substrate; and unloading the cooled substrate to outside the reaction container.

In some embodiments, the process of cooling the processed substrate may include rotating the substrate mounting member.

In some embodiments, the process of cooling the processed substrate may include supplying the inert gas into the processing region.

Another aspect of the present disclosure may provide a method of manufacturing a semiconductor device includes: mounting a substrate on a substrate mounting member that is disposed in a reaction container having a plurality of processing regions including a first processing region and a second processing region; heating the substrate at a predetermined processing temperature, supplying a first gas into the first processing region, supplying a plasma-processed second gas into the second processing region, and passing the substrate through the first processing region and the second processing region to thereby form a thin film on the substrate; stopping supply of the first gas and the second gas into the reaction container, and supplying an inert gas into the reaction container; and unloading the substrate to outside the reaction container.

According to the substrate processing apparatus and the method of manufacturing a semiconductor device according to the present disclosure, an undesired reaction can be prevented from being occurred on a thin film due to residual heat after substrate processing is ended, the crystalline structure of the thin film can be stabilized, and the damage of a transfer robot can be reduced.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
   loading a plurality of substrates into a reaction container, and mounting the plurality of substrates on the same plane on a substrate support member disposed in the reaction container, an inside of the reaction container being partitioned by a partition structure into a first processing region, a first purge region, a second processing region, and a second purge region, which are sequentially arranged;
   processing the plurality of substrates by heating each of the plurality of substrates with a heater, exhausting the processing regions and the purge regions with an exhaust system, supplying a processing gas from a processing gas supply system into the processing regions, supplying an inert gas from an inert gas supply system into the purge regions, and rotating the substrate support member to alternately move each of the plurality of substrates between the processing regions and the purge regions in order to alternately supply the processing gas and the inert gas to each of the plurality of substrates a predetermined number of cycles;
   cooling the plurality of substrates, after finishing the predetermined number of cycles so that the processing of the plurality of substrates is completed, by stopping heating the plurality of substrates with the heater, stopping the processing gas supplied into the processing regions, supplying the inert gas from the inert gas supply system into the purge regions, and rotating the substrate support member to alternately move each of the plurality of substrates between the processing regions and the purge regions; and
   unloading the plurality of substrates, after the cooling of the plurality of substrates is completed, from the inside of the reaction container.

2. The method of claim 1, wherein a valve disposed in the inert gas supply system is maintained in an open state to supply the inert gas into the purge regions, after the processing of the plurality of substrates is completed and before the cooling of the plurality of substrates is started.

3. The method of claim 1, wherein the cooling of the plurality of substrates comprises supplying the inert gas into the processing regions.

4. The method of claim 2, wherein the cooling of the plurality of substrates comprises supplying the inert gas into the processing regions.

5. The method of claim 1, wherein the processing gas supplied from the processing gas supply system into the second processing region is changed into a plasma state by a plasma generating unit which disposed in the second processing region.

6. The method of claim 1, wherein, during the processing of the plurality of substrates, each of the plurality of substrates is heated to within a range of 200 degrees Celsius to 400 degrees Celsius.

7. The method of claim 1, further comprising:
   loading the plurality of substrates unloaded from the inside of the reaction container into a cooling chamber, and
   cooling the plurality of substrates by supplying an inert gas into the cooling chamber.

8. A method of manufacturing a semiconductor device, comprising:
   loading a plurality of substrates into a reaction container, and mounting the plurality of substrates on the same plane on a substrate support member disposed in the reaction container, an inside of the reaction container being partitioned by a partition structure into a first processing region, a first purge region, a second processing region, and a second purge region, which are sequentially arranged;
   processing the plurality of substrates by heating each of the plurality of substrates with a heater, exhausting the processing regions and the purge regions with an exhaust system, supplying a processing gas from a processing gas supply system into the processing regions, supplying an inert gas from an inert gas supply system into the purge regions, and rotating the substrate support member to alternately move each of the plurality of substrates between the processing regions and the purge regions in order to alternately supply the processing gas and the inert gas to each of the plurality of substrates a predetermined number of cycles;

cooling the plurality of substrates, after finishing the predetermined number of cycles so that the processing of the plurality of substrates is completed, by stopping heating the plurality of substrates with the heater, reducing the processing gas supplied into the processing regions to such a flow rate that a film is not formed on each of the plurality of substrates, supplying the inert gas from the inert gas supply system into the purge regions, and rotating the substrate support member to alternately move each of the plurality of substrates between the processing regions and the purge regions; and unloading the plurality of substrates, after the cooling of the plurality of substrates is completed, from the inside of the reaction container.

9. The method of claim 8, wherein the cooling of the plurality of substrates comprises supplying the inert gas into the processing regions.

10. The method of claim 8, wherein, during the processing of the plurality of substrates, each of the plurality of substrates is heated to within a range of 200 degrees Celsius to 400 degrees Celsius.

11. The method of claim 8, further comprising:
loading the plurality of substrates unloaded from the inside of the reaction container into a cooling chamber,
cooling the plurality of substrates by supplying an inert gas into the cooling chamber.

* * * * *